United States Patent
Yamada et al.

(10) Patent No.: US 6,890,824 B2
(45) Date of Patent: May 10, 2005

(54) SEMICONDUCTOR DEVICE AND MANUFACTURING METHOD THEREOF

(75) Inventors: Takayuki Yamada, Osaka (JP); Isao Miyanaga, Nara (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 10/225,162

(22) Filed: Aug. 22, 2002

(65) Prior Publication Data

US 2003/0038320 A1 Feb. 27, 2003

(30) Foreign Application Priority Data

Aug. 23, 2001 (JP) ....................................... 2001-252237

(51) Int. Cl.[7] .......................................... H01L 21/336
(52) U.S. Cl. ..................... 438/301; 438/302; 438/303
(58) Field of Search ............................... 438/301, 302, 438/303, 300, 160, 166, 699, 530

(56) References Cited

FOREIGN PATENT DOCUMENTS

| JP | 5-3206 | 1/1993 |
|---|---|---|
| JP | 05-326552 | 12/1993 |
| JP | 7-106567 | 4/1995 |
| JP | 8-279597 | 10/1996 |
| JP | 9-199720 | 7/1997 |
| JP | 10-98186 | 4/1998 |
| JP | 11-126900 A | 5/1999 |
| JP | 11-317458 | 11/1999 |

*Primary Examiner*—John F Niebling
*Assistant Examiner*—Walter L. Lindsay, Jr.
(74) *Attorney, Agent, or Firm*—McDermott Will & Emery LLP

(57) ABSTRACT

After forming a gate electrode on a semiconductor substrate, ion implantation is performed on the semiconductor substrate by using the gate electrode as a mask to form low concentration impurity regions, and thereafter first sidewall insulating films are formed on the side surfaces of the gate electrode. Next, by using the gate electrode and the first sidewall insulating films as a mask, ion implantation is performed on the semiconductor substrate to form high concentration impurity regions, and thereafter second sidewall insulating films are formed on the side surfaces of the first sidewall insulating films. After that, by using each sidewall insulating film as a mask, metal silicide layers are selectively formed on each surface of the semiconductor substrate and the gate electrode.

9 Claims, 20 Drawing Sheets

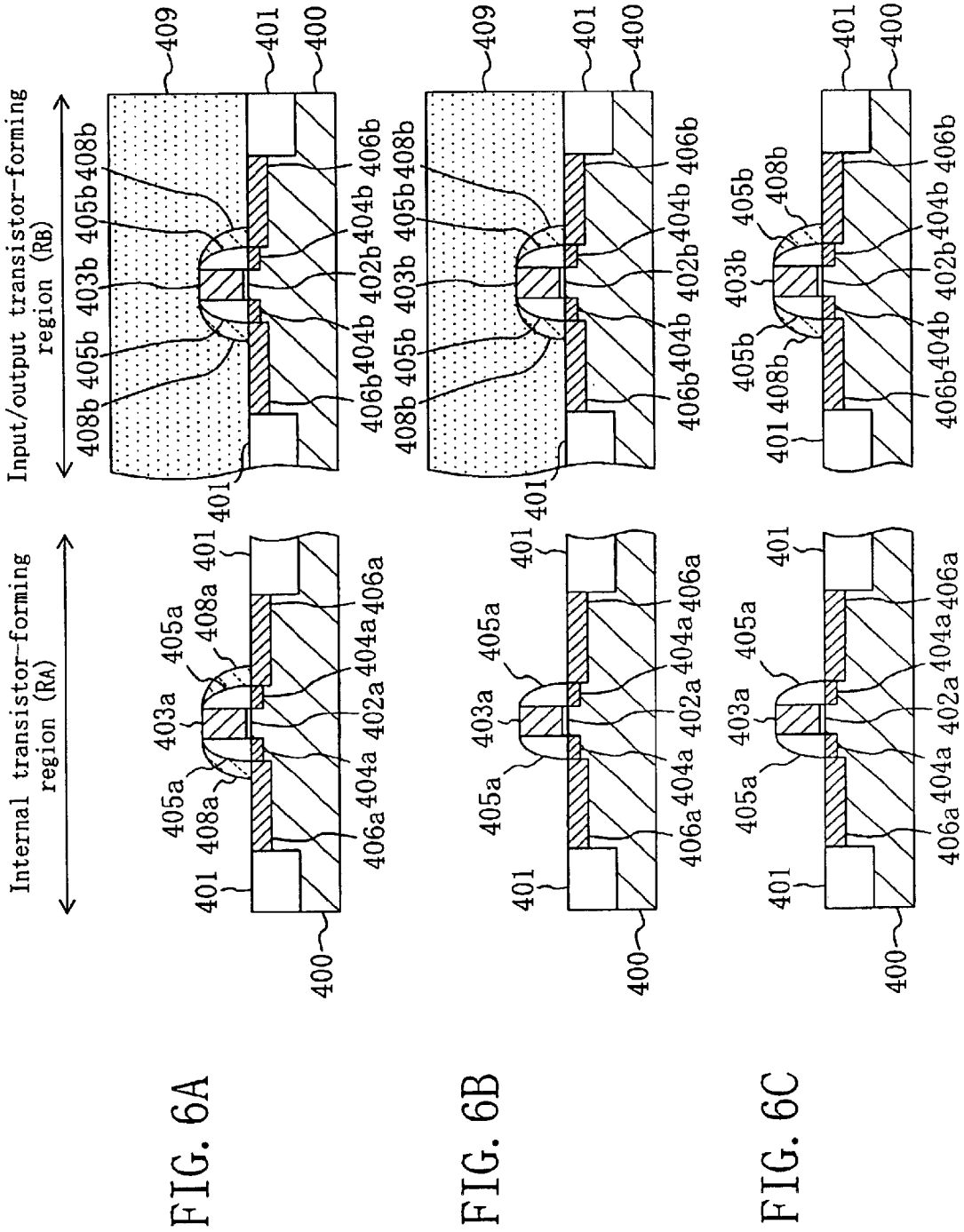

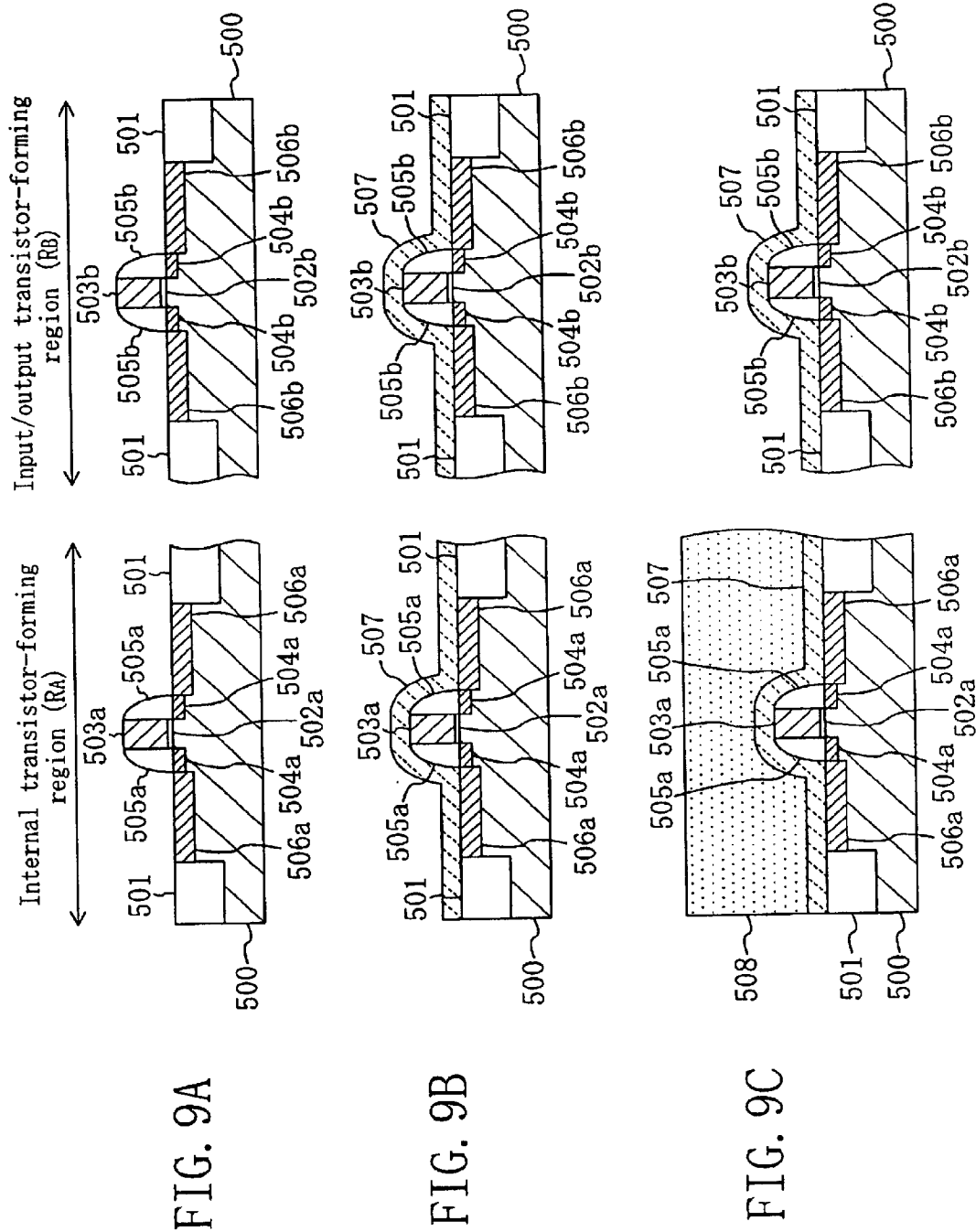

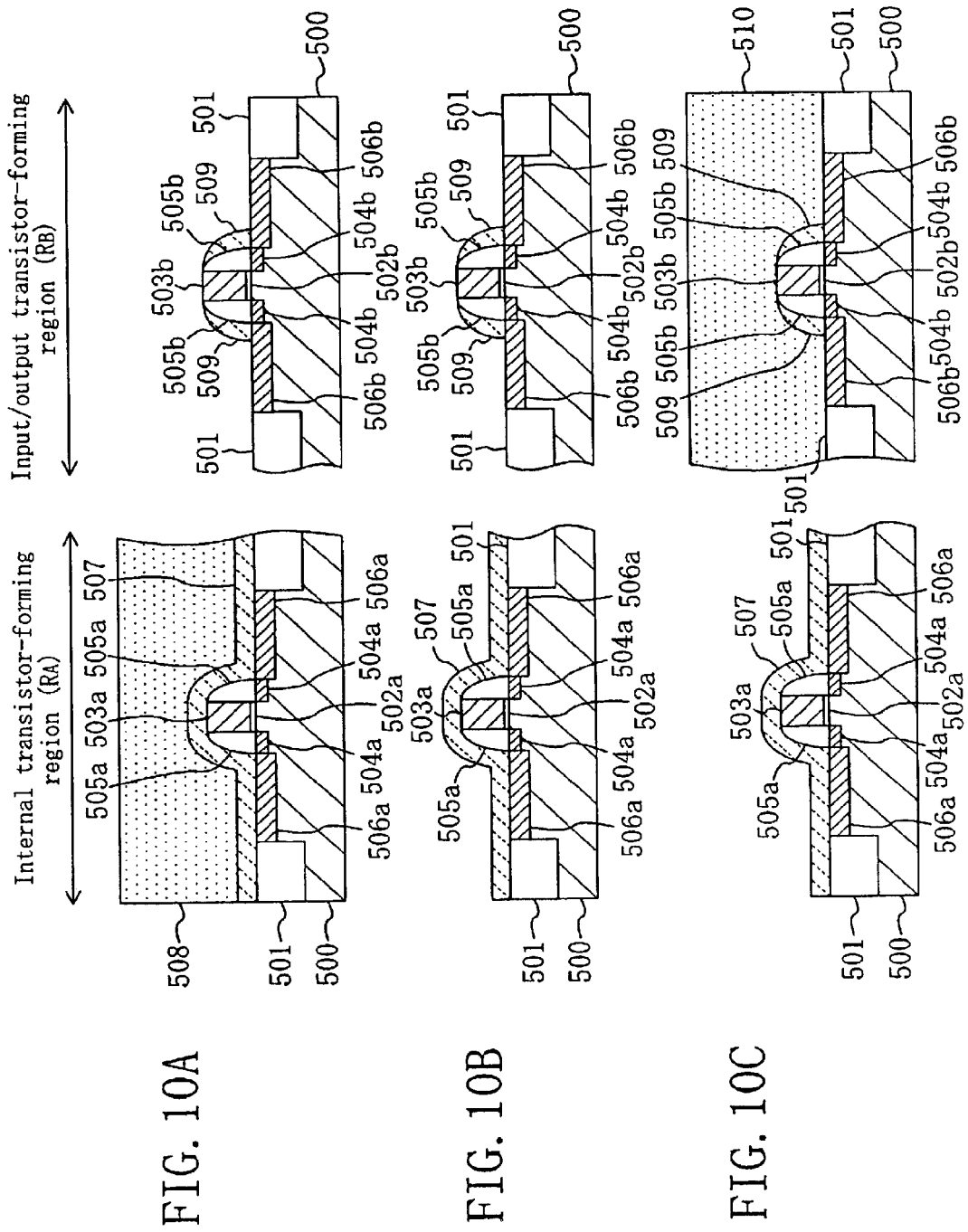

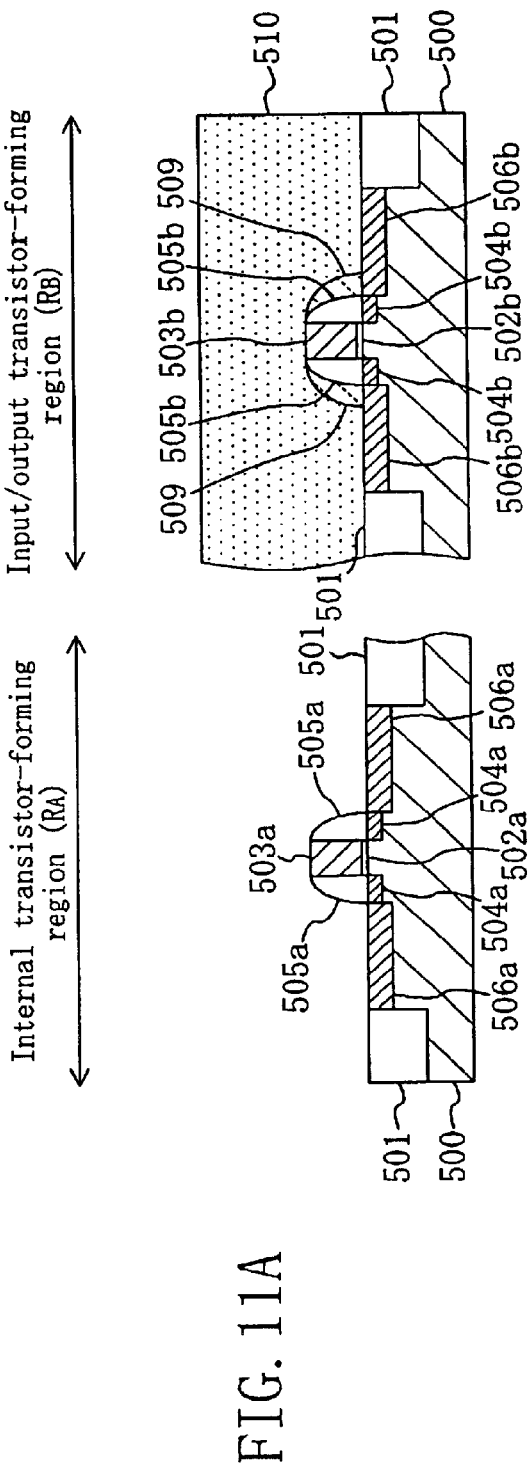
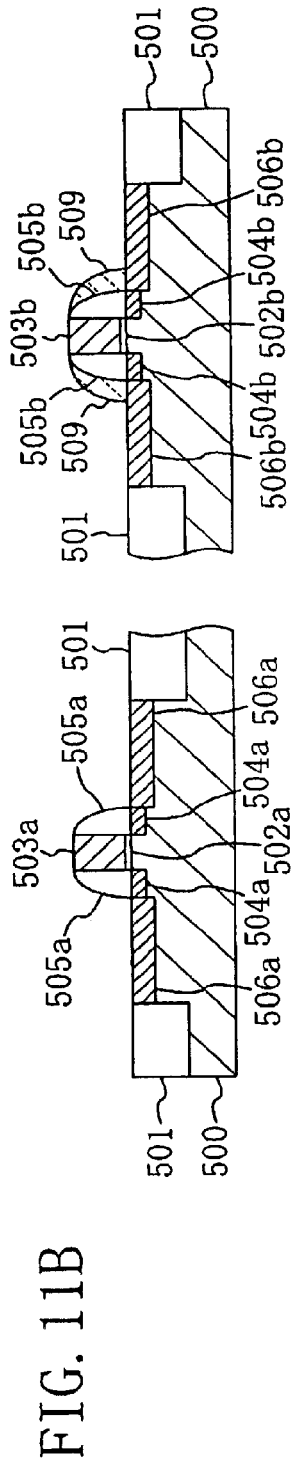
FIG. 11A
FIG. 11B

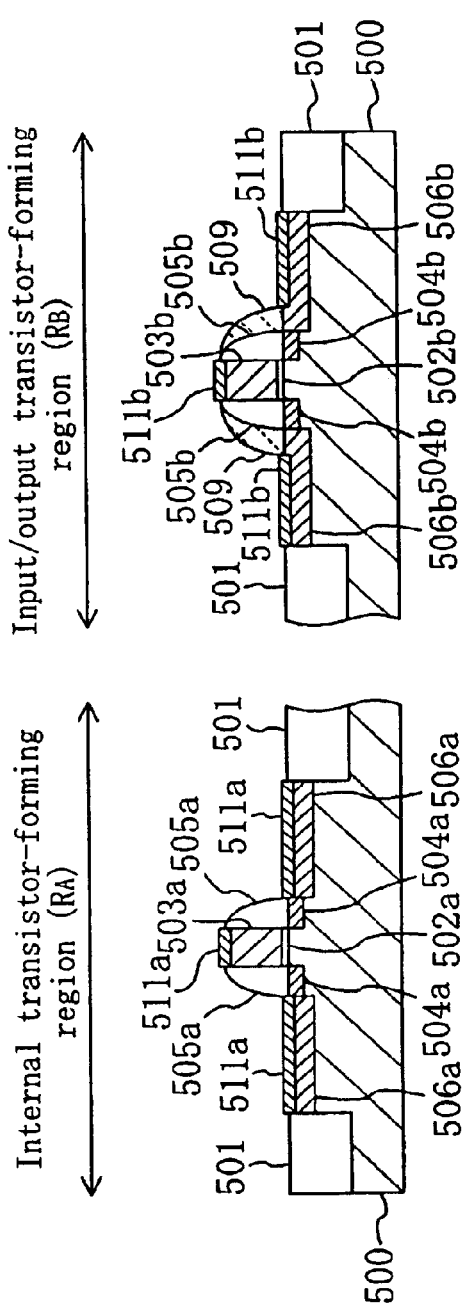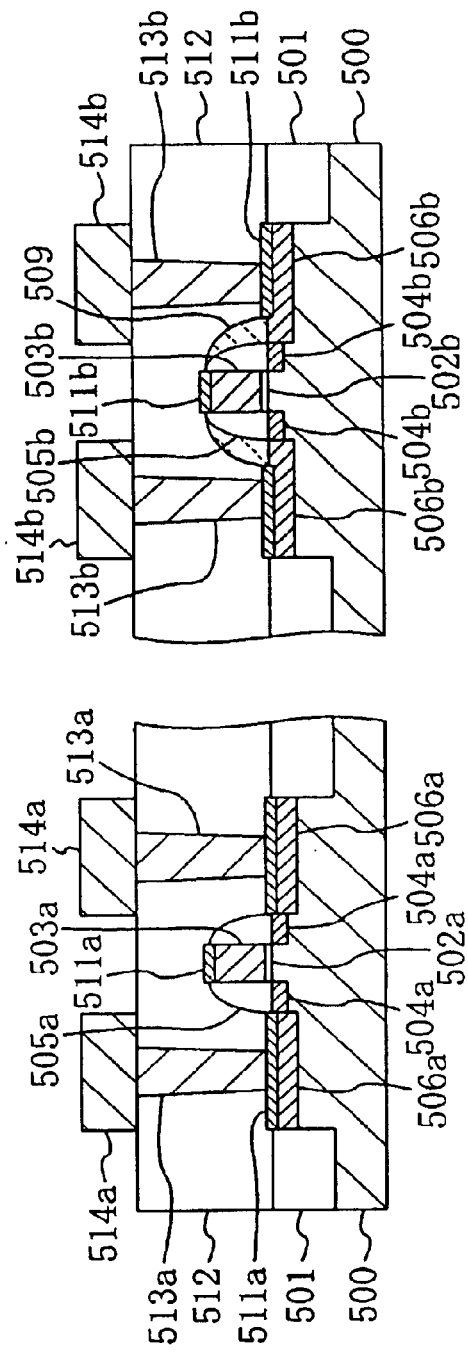

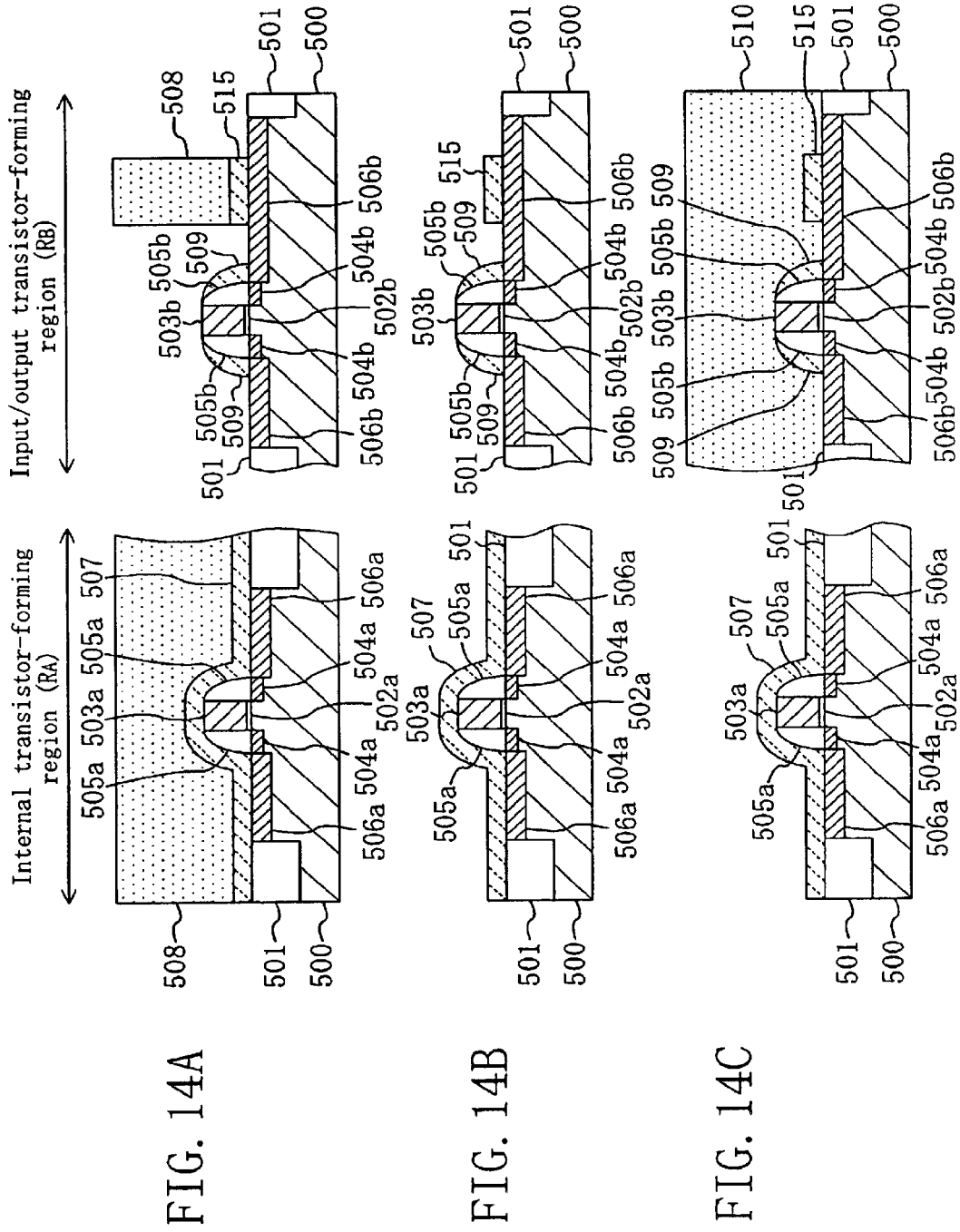

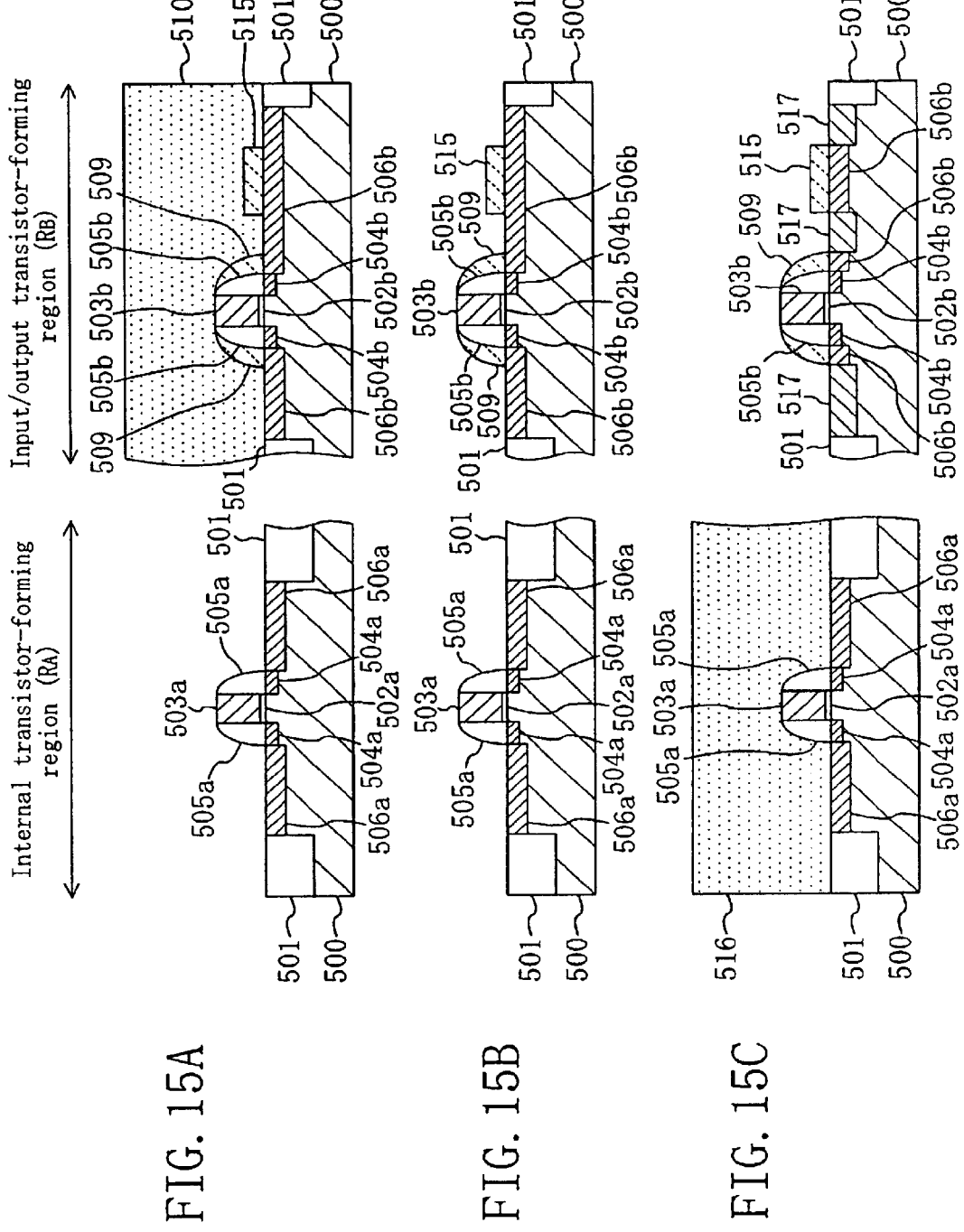

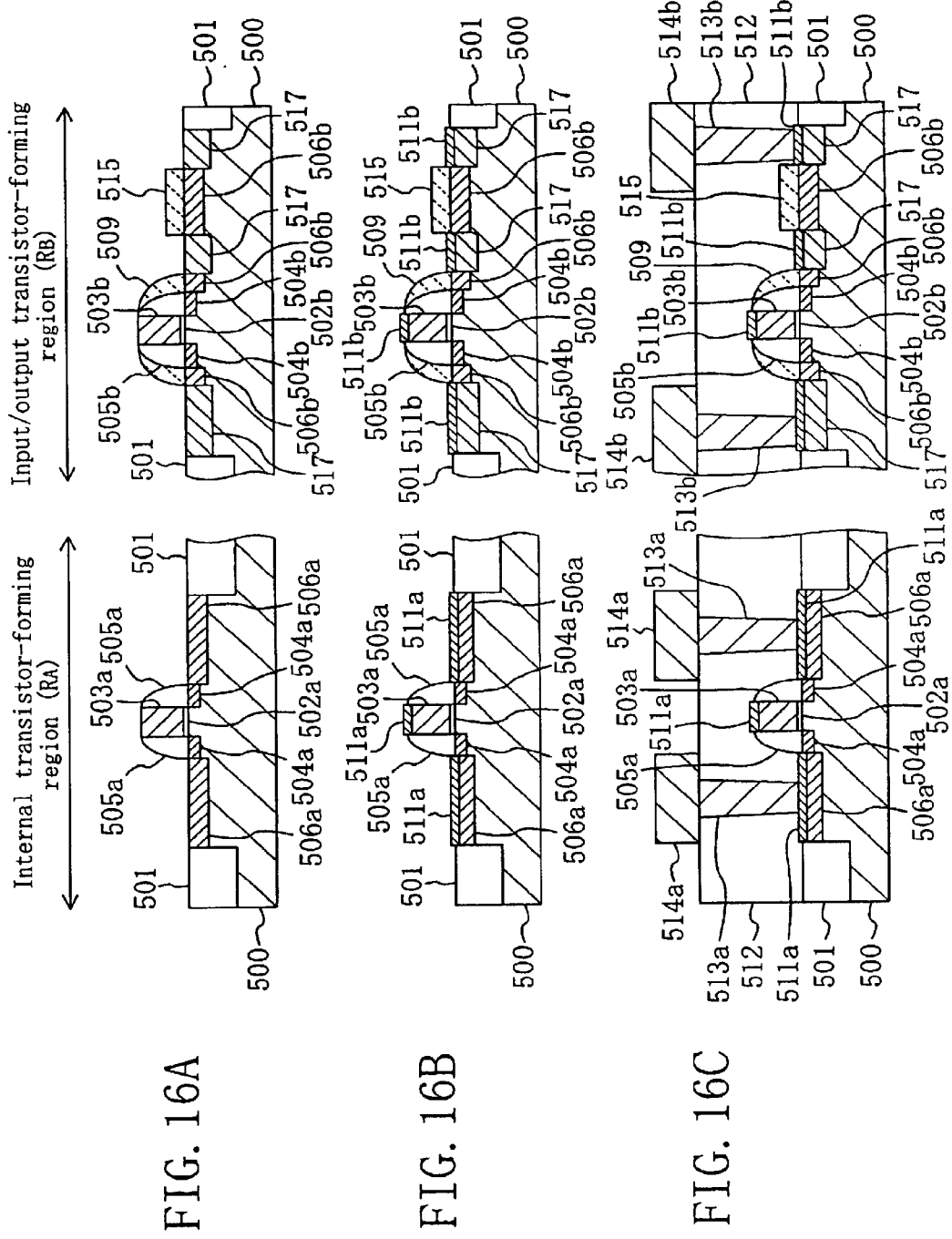

SEMICONDUCTOR DEVICE AND MANUFACTURING METHOD THEREOF

BACKGROUND OF THE INVENTION

The invention relates to a semiconductor device including a MIS transistor in which metal suicide layers are selectively formed on a surface of a gate electrode and on a surface of the portion of the semiconductor substrate to be a high concentration impurity region, and relates to a manufacturing method of the device.

In the manufacturing of semiconductor devices in recent years, a salicide-forming technology has been used for lowering the resistance of gate electrodes, source electrodes or drain electrodes, in which technology metal suicide films are formed on each electrode at the same time by the reaction of silicon constituting each electrode and a refractory metal material such as Ti, Co, or Ni.

Further, in the actual manufacturing of semiconductor devices, in order to increase resistance to electrostatic discharge puncture caused by ESD (Electro-Static Discharge) and the like, a resistance element connected in series with the transistor has been provided by not forming silicide in a portion of the source region and drain region.

FIGS. 19A to C and FIGS. 20A to C are cross-sectional views for showing each step in a method for manufacturing a semiconductor device according to a first conventional example, specifically a method for manufacturing a MIS type transistor in which a silicide region and a non-silicide region are separately formed.

First, as shown in FIG. 19A, an input/output transistor-forming region $r_A$ and an internal transistor-forming region $r_B$ are partitioned by forming an isolation insulating film 11 in a p-type silicon substrate 10. After that, a first gate electrode 13*a* of an n-type polycrystalline silicon film is formed above the input/output transistor-forming region $r_A$ with a first gate insulating film 12*a* interposed between the first gate electrode 13*a* and the input/output transistor-forming region $r_A$. Further, a second gate electrode 13*b* of an n-type polycrystalline silicon film is formed above the internal transistor-forming region $r_B$ with a second gate insulating film 12*b* interposed between the second gate electrode 13*b* and the internal transistor-forming region $r_B$. Thereafter, by using the first gate electrode 13*a* as a mask, ion implantation is performed on the input/output transistor-forming region $r_A$, thereby forming a first n-type low concentration impurity region 14*a*. Also, by using the second gate electrode 13*b* as a mask, ion implantation is performed on the inner transistor-forming region $r_B$, thereby forming a second n-type low concentration impurity region 14*b*. After that, first sidewall insulating films 15*a* are formed on the side surfaces of the first gate electrode 13*a* and, at the same time, second side-wall insulating films 15*b* are formed on the side surfaces of the second gate electrode 13*b*. Thereafter, by using the first gate electrode 13*a* and the first sidewall insulating films 15*a* as a mask, ion implantation is performed on the input/output transistor-forming region $r_A$, thereby forming n-type high concentration impurity regions 16*a* to configure a source region and a drain region. Also, by using the second gate electrode 13*b* and the second sidewall insulating films 15*b* as a mask, ion implantation is performed on the internal transistor-forming region $r_B$, thereby forming second high concentration impurity regions 16*b* to configure a source region and a drain region.

Next, as shown in FIG. 19B, a silicon oxide film 17 is deposited all over the semiconductor substrate 10. Thereafter, as shown in FIG. 19C, by using a resist pattern 18 as a mask covering a non-silicide region in which silicide is not provided (the first gate electrode 13*a*, first sidewall insulating film 15*a*, and the portion of the first high concentration impurity region 16*a* located in proximity to the first low concentration impurity region 14*a*), wet etching is performed on the silicon oxide film 17.

Then, after the resist pattern 18 is removed, a refractory metal film 19 is deposited all over the semiconductor substrate 10 as shown in FIG. 20A. Thereafter, as shown in FIG. 20B, by using the isolation insulating film 11, the second sidewall insulating film 15*b*, and the residual silicon oxide film 17 still remaining on the non-silicide region as a mask, heat treatment is applied on the semiconductor substrate 10. Thereby, first refractory metal suicide films 20*a* are selectively formed on the surfaces of the first high concentration impurity regions 16*a* except for their portions located underneath the residual silicon oxide film 17. Also, a second refractory metal silicide film 20*b* is selectively formed on each surface of the second gate electrode 13*b* and the second high concentration impurity region 16*b*. After that, the unreacted refractory metal film 19 is removed by wet etching using an etching solution including $H_2SO_4$ and $H_2O_2$, etc.

Next, as shown in FIG. 20C, after the formation of an inter-layer insulating film 21 all over the semiconductor substrate 10, a first contact 22*a* connecting to the first high concentration impurity region 16*a* through the refractory metal silicide film 20*a* and a second contact 22*b* connecting to the second high concentration impurity region 16*b* through the second refractory metal silicide film 20*b* are formed in the inter-layer insulating film 21. Thereafter, a first metal wiring line 23*a* connecting to the first contact 22*a* and a second metal wiring line 23*b* connecting to the second contact 22*b* are formed on the inter-layer insulating film 21. This completes the manufacturing of the MIS transistors in which the silicide region and the non-silicide region are separately manufactured.

However, the first conventional example has a problem that the gate resistance of the input/output transistor is increased because silicide is not formed also on the first gate electrode 13*a*.

By the way, the official gazette of Japanese Patent Laid-Open No. 11-126900 (hereinafter, referred to as a second conventional example) discloses a method for forming a second sidewall insulating film on the side surface of a gate electrode of an input/output transistor with a first sidewall insulating film interposed between the second sidewall insulating film and the gate electrode, thereby preventing a metal silicide layer from being formed on regions located underneath the second sidewall insulating films in the surfaces of high concentration impurity regions to configure the source region and drain region of the input/output transistor. However, according to the second conventional example, in the internal transistor-forming region, a metal suicide layer is formed not only on the surfaces of the high concentration impurity regions to configure the source region and drain region, but also the metal silicide layer is formed on the surfaces of low concentration impurity regions having a shallow junction depth. This results in a problem of an increased junction leakage current.

SUMMARY OF THE INVENTION

In view of the above problems, the invention has a first object to provide a transistor having metal silicide layers formed on the surface of the gate electrode and on the surface of the high concentration impurity regions to configure the source region and drain region, and having a non-silicidized region to be a resistance element provided in a portion of the high concentration impurity region. Further, the invention has a second object to achieve the first object in an input/output transistor while preventing an increase in junction leakage current in an internal transistor.

In order to achieve the first object, a first method for manufacturing a semiconductor device according to the invention comprises a step of forming gate electrode on a semiconductor substrate, a step of forming low impurity concentration regions by performing ion implantation on the semiconductor substrate by using the gate electrode as a mask, a step of depositing a first insulating film over the semiconductor substrate in which the low concentration impurity regions are formed, a step of forming first sidewall insulating films on the side surfaces of the gate electrode by performing anisotropic dry etching on the first insulating film, a step of forming high concentration impurity regions by performing ion implantation on the semiconductor substrate by using the gate electrode and the first sidewall insulating films as a mask, a step of depositing a second insulating film over the semiconductor substrate in which the high concentration impurity regions are formed, a step of forming second sidewall insulating films on the portions of said high concentration impurity regions located in proximity to the low concentration impurity regions and on the side surfaces of the first sidewall insulating films by performing anisotropic dry etching on the second insulating film, and a step of selectively forming metal silicide layers on the exposed region of each surface of the semiconductor substrate and the gate electrode by using the first sidewall insulating films and the second sidewall insulating films as a mask.

According to the first method for manufacturing a semiconductor device, after forming low concentration impurity regions on both sides of a gate electrode in a semiconductor substrate, first sidewall insulating films are formed on the side surfaces of the gate electrode and thereafter high concentration impurity regions are formed on both sides of the gate electrode in the semiconductor substrate so as to adjoin to the low concentration impurity regions. After forming second sidewall insulating films on the side surfaces of the first sidewall insulating films, by using the first sidewall insulating films and second sidewall insulating films as a mask, metal silicide layers are selectively formed on the respective exposed portions of the semiconductor substrate and the gate electrode. That is, it is possible to lower the resistance of the gate electrode by forming the metal silicide layer on the gate electrode. Also, because the metal silicide layers are formed, in a manner of self-alignment, on the high concentration impurity regions except for their portions located underneath the second sidewall insulating films, these portions located underneath the second sidewall insulating films in the high concentration impurity regions function as resistance elements connected in series with the MIS type transistor, thereby increasing resistance to electrostatic discharge puncture caused by ESD and the like.

In the first method for manufacturing a semiconductor device, preferably, the method further comprises a step of performing ion implantation on the semiconductor substrate by using the gate electrode, first sidewall insulating films, and second sidewall insulating films as a mask, in between the step of forming the second sidewall insulating films and the step of forming the metal silicide layers, making the depth of the high concentration impurity regions except for their portions located underneath the second sidewall insulating films deeper than the depth of these portions located underneath the second sidewall insulating films in the high concentration impurity regions.

According to this method, the metal silicide layer formed on the semiconductor substrate is formed only on the surface of the portion, having a relatively deeper junction, of the high concentration impurity region, and therefore it is ensured to supress the increase of junction leakage current resulting from the formation of the metal silicide layer. Also, because the portion, having a relatively deeper junction depth, of the high concentration impurity region is separated from the channel region of the MIS type transistor by the first sidewall insulating film and the second sidewall insulating film, it is possible to suppress the increase of variations in the transistor characteristics resulting from the spread of a depletion layer from the high concentration impurity region (that is, short channel effect).

In the first method for manufacturing a semiconductor device, preferably, the method further comprises a step of forming a resist pattern to cover the portion of the second insulating film deposited on the top side of a resistance element-forming region in the high concentration impurity region, in between the step of depositing the second insulating film and the step of forming the second sidewall insulating film, and the step of forming the second sidewall insulating films includes a step of performing anisotropic dry etching on the second insulating film by using the resist pattern as a mask to leave the second insulating film on the resistance element-forming region.

According to this method, the metal silicide film can be formed, in a self-alignment manner, on the high concentration impurity regions except for their portions located underneath each of the second sidewall insulating films and the residual second insulating film. As a result, the portion of the high concentration impurity region located underneath the second sidewall insulating films (first resistance element) and the portion of the high concentration impurity region located underneath the residual second insulation film (second resistance element) each function as resistance elements connected in series with the MIS type transistor, thereby improving resistance to electrostatic discharge puncture caused by ESD and the like. Also, it is possible to increase the degree of flexibility in designing the resistance value of a resistance element connected in series with the MIS type transistor. Further, in the present structure in which the first resistance element and the second resistance element are connected in series with the MIS type transistor, the value of resistance from the channel region of the MIS type transistor to the contact hole provided on the high concentration impurity region is a combined resistance (R1+R2+R3+R4+R5) of the resistance of the low concentration impurity region (R1), the resistance of the first resistance element in the high concentration impurity region (R2), the resistance of the portion between the first resistance element and the second resistance element in the high concentration impurity region (the portion having the metal silicide layer formed) (R3), the resistance of the second resistance element in the high concentration impurity region (R4), and the resistance of the portion between the second resistance element and the contact hole in the high concentration impurity region(the portion having the metal silicide layer formed) (R5). Herein, the values of R1, R2, R4 and R3+R5 each do not depend on misalignment in a resist pattern-forming step of forming the second resistance element, and therefore it is possible to suppress variations in resistance caused by the variation in alignment in a resist pattern-forming step.

In the first method for manufacturing a semiconductor device, preferably, the method further comprises a step of forming offset spacers on the side surfaces of the gate electrode in between the step of forming the gate electrode and the step of forming the low concentration impurity regions, and the step of forming the low concentration impurity regions includes a step of performing ion implantation on the semiconductor substrate by using the gate electrode and the offset spacers as a mask to form the low concentration impurity regions.

According to this method, because an overlap length between the gate electrode and the source and drain regions can be shortened, it is possible to decrease overlap capacitance produced between the gate electrode and the source and drain regions. Therefore, parasitic capacitance of the MIS type transistor can be decreased, thereby improving the circuit operation speed.

In order to achieve the above second object, a second method for manufacturing a semiconductor device comprises a step of partitioning a first transistor-forming region and a second transistor-forming region by forming an isolation insulating film in a semiconductor substrate, a step of forming a first gate electrode on the first transistor-forming region via a first gate insulating film, a step of forming a second gate electrode on the second transistor-forming region via a second gate insulating film, a step of forming first low concentration impurity regions by performing ion implantation on the first transistor-forming region by using the first gate electrode as a mask, a step of forming second low concentration impurity regions by performing ion implantation on the second transistor-forming region by using the second gate electrode as a mask, a step of depositing a first insulating film over the semiconductor substrate in which the first low concentration impurity regions and the second low concentration impurity regions have been provided, a step of forming first sidewall insulating films on the side surfaces of the first gate electrode and, at the same time, forming second sidewall insulating films on the side surfaces of the second gate electrode, by performing anisotropic dry etching on the first insulating film, a step of forming first high concentration impurity regions by performing ion implantation on the first transistor-forming region by using the first gate electrode and the first sidewall insulating films as a mask, a step of forming second high concentration impurity regions by performing ion implantation on the second transistor-forming region by using the second gate electrode and the second sidewall insulating films as a mask, a step of depositing a second insulating film over the semiconductor substrate in which the first high concentration impurity regions and the second high concentration impurity regions have been formed, a step of forming third sidewall insulating films on the portions of the second high concentration impurity regions located in proximity of the second low concentration impurity regions and on the side surfaces of the second sidewall insulating films, and a step of selectively forming metal silicide layers on the exposed region of each surface of the first transistor-forming region, the second transistor-forming region, the first gate electrode, and the second gate electrode by using the isolation insulating film, the first sidewall insulating film, the second sidewall insulating film, and the third sidewall insulating mask as a mask.

According to the second method for manufacturing a semiconductor device, the first low concentration impurity regions are formed on both sides of the first gate electrode in the first transistor-forming region and at the same time, the second low concentration impurity regions are formed on both sides of the second gate electrode in the second transistor-forming region. After that, the first sidewall insulating films are formed on the side surfaces of the first gate electrode and at the same, the second sidewall insulating films are formed on the side surfaces of the second gate electrode. Thereafter, the first high concentration impurity regions are formed on both sides of the first gate electrode in the first transistor-forming region so as to adjoin to the first low concentration impurity region, and at the same, the second high concentration impurity regions are formed on both sides of the second gate electrode in the second transistor-forming region so as to adjoin to the second low concentration impurity region. After that, the third sidewall insulating films are formed on the side surfaces of the second sidewall insulating films, and thereafter, by using the isolation insulating film, first sidewall insulating film, second sidewall insulating film, and third sidewall insulating film as a mask, the metal silicide layers are selectively formed on the respective exposed portions of the semiconductor substrate, first gate electrode, and second gate electrode. That is, the first gate electrode and the first high concentration impurity regions of the first transistor (for example, internal transistor) as well as the second gate electrode of the second transistor (for example, input/output transistor) each can be silicidized to lower their resistance. Also, in the input/output transistor, the metal silicide layers can be formed, in a manner of self-alignment, on the second high concentration impurity regions except for their portions located underneath the third sidewall insulating films. As a result, these portions located underneath the third sidewall insulating films in the second high concentration impurity regions function as a resistance element connected in series with the input/output transistor, thereby improving resistance to electrostatic discharge puncture caused by ESD and the like. Further, on the surface of the semiconductor substrate, no metal silicide layer is formed outside the first and second high concentration impurity regions, and therefore, in both of the internal transistor and the input/output transistor, it is possible to prevent an increase in junction leakage current.

In the second method for manufacturing a semiconductor device, preferably, the step of forming the third sidewall insulating films includes a step of forming fourth sidewall insulating films on the portions of the first high concentration impurity regions located in proximity of the first low concentration impurity regions and on the side surfaces of the first sidewall insulating films, and the second method further comprises a step of selectively removing the fourth sidewall insulating films by using a resist pattern covering the second transistor-forming region as a mask, and thereafter removing the resist pattern, in between the step of forming the third sidewall insulating films and the step of forming the metal silicide layers.

According to this method, by performing only a lithography step for forming the resist pattern covering the second transistor-forming region, required for removing the fourth sidewall insulating film in the first transistor-forming region, the second method for manufacturing a semiconductor device can be easily implemented. By the way, at this time, as the material of the second insulating film to configure the fourth sidewall insulating films, it is preferable to select a material that can be wet etched with a high selectivity with respect to the isolation insulating film or the first insulating film to configure the first sidewall insulating film. This way can prevent the isolation insulating film or the first sidewall insulating film from being etched when wet etching is performed on the fourth sidewall insulating film.

In the second method for manufacturing a semiconductor device, preferably, the step of forming the third sidewall insulating film includes a step of forming the third sidewall insulating film by performing anisotropic dry etching on the second insulating film by using a first resist pattern covering the first transistor-forming region as a mask and thereafter removing the first resist pattern, and the second method further comprises a step of selectively removing the residual portion of the second insulating film remaining on the first transistor-forming region by using a second resist pattern covering the second transistor-forming region as a mask, and thereafter removing the second resist pattern, in between the step of forming the third sidewall insulating films and the step of forming the metal silicide layers.

According to this method, it is necessary to perform both a lithography step for forming the first resist pattern required for forming the third sidewall insulating film in the second transistor-forming region and a lithography step for forming the second resist pattern required for removing the residual portion of the second insulating film remaining on the first transistor-forming region. On the other hand, this method can eliminate the need for selective wet etching on the fourth sidewall insulating film, which is required when the fourth sidewall insulating film is formed in the first transistor-forming region. Therefore, it is possible to increase a process margin in the wet etching step, thereby preventing, for example, the etching of the isolation insulating film.

Further, at this time, preferably, the first resist pattern is formed so as to cover the portion of the second insulating film deposited on the top side of the resistance element-forming region in the second high concentration impurity region, and the step of forming the third sidewall insulating film includes a step of leaving the second insulating film on the resistance element-forming region.

According to this method, by forming only the first resist pattern so as to cover the portion of the second insulating film deposited on the top side of the resistance element-forming region in the second high concentration impurity region, the metal silicide layer can be formed by using the second insulating film remaining on this resistance element-forming region as a mask. As a result, the portion of the second high concentration impurity region located underneath the residual second insulating film can be easily formed as a resistance element connected in series with the MIS type transistor, thereby simply improving resistance to electrostatic discharge puncture caused by ESD and the like.

In the second method for manufacturing a semiconductor device, preferably, the second method further comprises a step of performing ion implantation on the second transistor-forming region by using the resist pattern covering the first transistor-forming region, the second gate electrode, the second sidewall insulating film, and the third sidewall insulating film as a mask, making the depth of the second high concentration impurity regions except for their portions located underneath the third sidewall insulating films deeper than the depth of these portions of the second high concentration impurity regions located underneath the third sidewall insulating films, in between the step of forming the third sidewall insulating films and the step of forming the metal silicide layers.

According to this method, the metal silicide layers formed on the second high concentration impurity region is formed only on the surfaces of the portions, having a relatively deeper junction depth, of the second high concentration impurity region, thereby reliably suppressing the increase of junction leakage current resulting from the formation of the metal silicide layer. Also, the portions, having a relatively deeper junction depth, of the second high concentration impurity regions is separated from the channel region of the MIS type transistor (second transistor) by the second sidewall insulating film and the third sidewall insulating film. Therefore, it is possible to suppress the increase of variations in transistor characteristics resulting from the spread of a depletion layer from the second high concentration impurity region (that is, short channel effect).

A semiconductor device according to the invention comprises a MIS transistor having a gate insulating film formed on a transistor-forming region in a semiconductor substrate, a gate electrode formed on the gate insulating film, first sidewall insulating films formed on the side surfaces of the gate electrode, low concentration impurity regions formed underneath the first sidewall insulating films in the transistor-forming region, and high concentration impurity regions formed outside the gate electrode in the transistor-forming region so as to adjoin to the low concentration impurity regions, wherein second sidewall insulating films are formed on the portions of the high concentration impurity regions located in proximity to the low concentration impurity regions and on the side surfaces of the first sidewall insulating films, and metal silicide layers are formed on the surface of the gate electrode and on the surfaces of the high concentration impurity regions except for their portions located underneath the second sidewall insulating films.

That is, the semiconductor device of the invention is a semiconductor device obtained by using the first method for manufacturing a semiconductor device according to the invention, and therefore it provides the same advantages as the first method for manufacturing a semiconductor device. Specifically, the gate electrode of the MIS type transistor (for example, input/output transistor) is silicidized to lower its resistance. Also, because the high concentration impurity regions except for their portions located underneath the second sidewall insulating films are silicidized, the portions of the high concentration impurity regions located underneath the second sidewall insulating films function as resistance elements connected in series with the MIS type transistor, thereby increasing resistance to electrostatic discharge puncture caused by ESD and the like.

In the semiconductor device according to the invention, preferably, the metal silicide layer is discontinuously provided on the surface of the high concentration impurity region except for its portion located underneath the second sidewall insulating film.

According to this, in addition to the portions of the high concentration impurity region located underneath the second sidewall insulating films (first resistance element), other portions of the high concentration impurity region on which the metal silicide layer are not formed (second resistance element) each function as resistance elements connected in series with the MIS type transistor, thereby increasing resistance to electrostatic discharge puncture caused by ESD and the like. Also, it is possible to increase the degree of flexibility in designing the resistance value of a resistance element connected in series with the MIS transistor.

In the semiconductor device according to the invention, the depth of the high concentration impurity regions except for their portions located underneath the second sidewall insulating films are preferably deeper than the depth of the portions of the high concentration impurity regions located underneath the second sidewall insulating films.

According to this, the metal silicide layer formed on the high concentration impurity region is formed only on the surface of the portion having a relatively deeper junction depth of the high concentration impurity region, thereby reliably suppressing the increase of junction leakage current resulting from the formation of the metal silicide layer. Also, because the portion, having a relatively deeper junction depth, of the high concentration impurity region is separated from the channel region of the MIS type transistor by the first sidewall insulating film and the second sidewall insulating film, it is possible to suppress the increase of variations in the transistor characteristics resulting from the spread of a depletion layer from the high concentration impurity region (that is, short channel effect).

In the semiconductor device according to the invention, the device may further comprise another MIS transistor having another gate insulating film formed on another transistor-forming region in the semiconductor substrate and having a thickness thinner than the gate insulating film, another gate electrode formed on the another gate insulating film, another sidewall insulating films formed on the side surfaces of the another gate electrode, another low concentration impurity regions formed underneath the another sidewall insulating films in the another transistor-forming region, and another high concentration impurity regions formed outside the another gate electrode in the another transistor-forming region so as to adjoin to the another low concentration impurity regions, wherein other metal silicide layers are formed on each surface of the another gate electrode and the another high concentration impurity regions.

BRIEF DESCRIPTION OF THE DRAWINGS

FIGS. 6A to C are cross-sectional views for showing each step in the method for manufacturing a semiconductor device according to the fourth embodiment of the invention.

FIGS. 9A to C are cross-sectional views for showing each step in a method for manufacturing a semiconductor device according to a fifth embodiment of the invention.

FIGS. 10A to C are cross-sectional views for showing each step in the method for manufacturing a semiconductor device according to the fifth embodiment of the invention.

FIGS. 11A and B are cross-sectional views for showing each step in the method for manufacturing a semiconductor device according to the fifth embodiment of the invention.

FIGS. 12A and B are cross-sectional views for showing each step in the method for manufacturing a semiconductor device according to the fifth embodiment of the invention.

FIGS. 14A to C are cross-sectional views for showing each step in the method for manufacturing a semiconductor device according to the variant example of the fifth embodiment of the invention.

FIGS. 15A to C are cross-sectional views for showing each step in the method for manufacturing a semiconductor device according to the variant example of the fifth embodiment of the invention.

FIGS. 16A to C are cross-sectional views for showing each step in the method for manufacturing a semiconductor device according to the variant example of the fifth embodiment of the invention.

DETAILED DESCRIPTION OF THE INVENTION

Embodiment 1

Hereinafter, a semiconductor device and a manufacturing method thereof according to a first embodiment of the invention will be described with reference to drawings, taking an n-type MISFET as an example.

FIGS. 1A to G are cross-sectional views for showing each step in a method for manufacturing a semiconductor device according to the first embodiment.

Figures 1A, 1B, 1C, 1D, 1E, 1F, 1G:
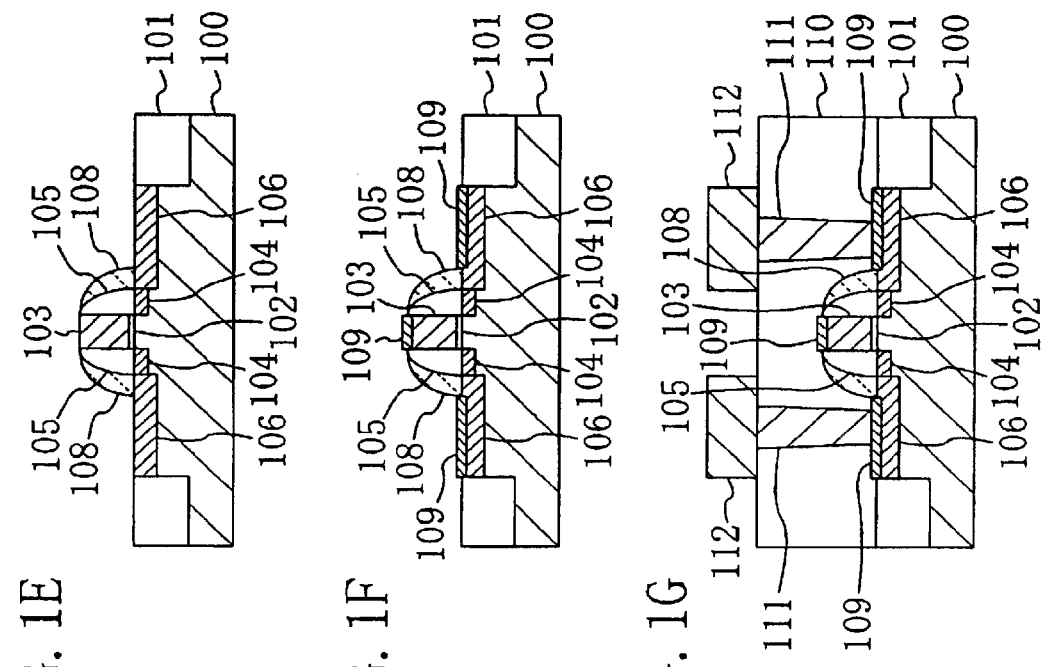
FIGS. 1A to G are cross-sectional views for showing each step in a method for manufacturing a semiconductor device according to a first embodiment of the invention.

First, as shown in FIG. 1A, after a transistor-forming region is partitioned in a p-type silicon substrate 100 by forming an isolation insulating film 101 of silicon oxide film therein, a gate insulating film 102 about 2 nm thick of a silicon oxynitride film is formed on the silicon substrate 100 by using a known method. After that, a gate electrode 103 about 150 nm thick of an n-type polycrystalline silicon film is formed on the gate insulating film 102. Then, by using the gate electrode 103 as a mask, ion implantation is performed on the silicon substrate 100, thereby forming n-type low concentration impurity regions 104.

Next, as shown in FIG. 1B, after a silicon nitride film 105A about 60 nm thick is deposited all over the silicon substrate 100, the silicon nitride film 105A is subjected to anisotropic dry etching. Thereby, as shown in FIG. 1C, first sidewall spacers 105 of silicon nitride film are formed on the side surfaces of the gate electrode 103. Then, by using the gate electrode 103 and the first sidewall spacers 105 as a mask, ion implantation is performed on the silicon substrate 100, thereby forming n-type high concentration impurity regions 106 to configure a source region and a drain region.

Then, after a silicon oxide film 107 about 60 nm thick is deposited all over the silicon substrate 100 as shown in FIG. 1D, the silicon oxide film 107 is subjected to anisotropic dry etching. Thereby, as shown in FIG. 1E, second sidewall spacers 108 of silicon oxide film are formed on the side surfaces of the gate electrode 103 with the first sidewall spacers 105 interposed between the second sidewall spacers 108 and the gate electrode 103. At this time, the second sidewall spacers 108 are formed on the portions of the high concentration impurity regions 106 located in proximity to the low concentration impurity regions 104 and on the side surfaces of the first sidewall spacers 105.

Next, after deposition of a metal film of, for example, Co or Ni or the like all over the silicon substrate 100, by using the isolation insulating film 101, first sidewall spacers 105, and second sidewall spacers 108 as a mask, heat treatment is applied on the silicon substrate 100. This causes the above metal film to react with the silicon-exposed region of each surface of the silicon substrate 100 and the gate electrode 103, forming metal silicide films 109 on the gate electrode 103 and on the high concentration impurity regions 106 except for their portions located underneath the second sidewall spacers 108, as shown in FIG. 1F. After that, an unreacted metal film is removed by wet etching using an etching solution including $H_2SO_4$ and $H_2O_2$ and the like.

Next, after forming an interlayer insulating film 110 all over the silicon substrate 100 by using a known method as shown in FIG. 1G, then contacts 111 connecting to the high concentration impurity regions 106 through the metal silicide films 109 are formed in the interlayer insulating film 110, and thereafter metal wiring 112 connecting to the contacts 111 are formed on the interlayer insulating film 110. Thereby, the manufacturing of an n-type MISFET is completed, which MISFET comprises the gate electrode 103 having the metal silicide film 109 formed in the upper layer thereof and the high concentration impurity regions 106 except for their portions located underneath the second sidewall spacers 108 having the metal silicide film 109 formed thereon.

According to the first embodiment, after forming the low concentration impurity regions 104 on both sides of the gate electrode 103 in the silicon substrate 100, then the first sidewall spacers 105 are formed on the side surfaces of the gate electrode 103, and thereafter, the high concentration impurity regions 106 are formed on both sides of the gate electrode 103 in the silicon substrate 100 so as to adjoin to the low concentration impurity regions 104. After that, the second sidewall spacers 108 are formed on the side surfaces of the gate electrode 103 with the first sidewall spacers 105 interposed between the second sidewall spacers 108 and the gate electrode 103, and thereafter, by using the isolation insulating film 101, first sidewall spacers 105, and second sidewall spacers 108 as a mask, the metal silicide films 109 are selectively formed on the respective silicon-exposed portions of the silicon substrate 100 and the gate electrode 103. That is, it is possible to lower the resistance of the gate electrode 103 by forming the metal silicide film 109 thereon. Also, the metal silicide films 109 are formed, in a manner of self-alignment, on the high concentration impurity regions 106 except for their portions located underneath the second sidewall spacers 108. This permits an improvement in resistance to electrostatic discharge puncture caused by ESD and the like, because the portions of the high concentration impurity regions 106 located underneath the second sidewall spacers 108 function as resistance elements connected in series with the MIS type transistor.

By the way, although in the first embodiment, polycrystalline silicon has been used as the material of the gate electrode 103, any semiconductor material such as silicon germanium or amorphous silicon may be used as the material of the gate electrode 103 without being particularly limited, provided it is a silicidizable material.

Also, although in the first embodiment, the first sidewall spacer 105 has a single layer structure of a silicon nitride film, instead of this, the first sidewall spacers 105 may have a multilayer structure of, for example, a silicon oxide film and a silicon nitride film.

Embodiment 2

Hereinafter, a semiconductor device and a manufacturing method thereof according to a second embodiment of the invention will be described with reference to drawings, taking an n-type MISFET as an example.

FIGS. 2A to F are cross-sectional views for showing each step in a method for manufacturing a semiconductor device according to the second embodiment.

Figure 2A:
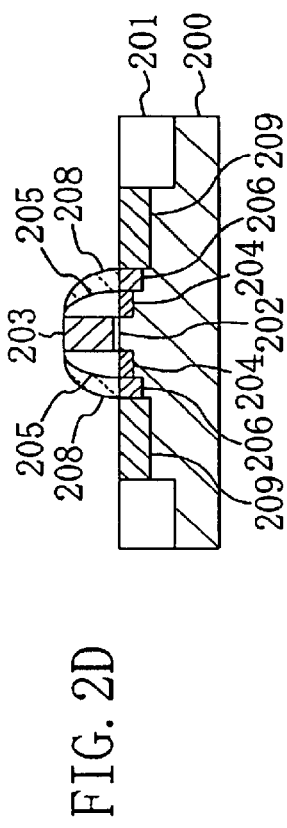
FIGS. 2A to F are cross-sectional views for showing each step in a method for manufacturing a semiconductor device according to a second embodiment of the invention.

First, as shown in FIG. 2A, after a transistor-forming region is partitioned in a p-type silicon substrate 200 by forming an isolation insulating film 201 of silicon oxide film, a gate insulating film 202 about 2 nm thick of a silicon oxynitride film is formed on the silicon substrate 200 by using a known method. After that, a gate electrode 203 about 150 nm thick of an n-type polycrystalline silicon film is formed on the gate insulating film 202. Then, by using the gate electrode 203 as a mask, ion implantation is performed on the silicon substrate 200, thereby forming n-type low concentration impurity regions 204. Thereafter, after depositing of a silicon nitride film about 60 nm thick all over the silicon substrate 200, anisotropic dry etching is performed on this silicon nitride film, thereby forming first sidewall spacers 205 on the side surfaces of the gate electrode 203. Then, by using the gate electrode 203 and first sidewall spacers 205 as a mask, ion implantation is performed on the silicon substrate 200, thereby forming first n-type high concentration impurity regions 206 to configure a source region and a drain region.

Figure 2B:
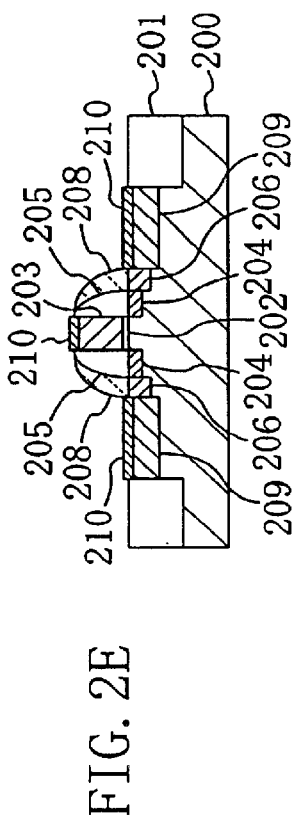
Figure 2C:
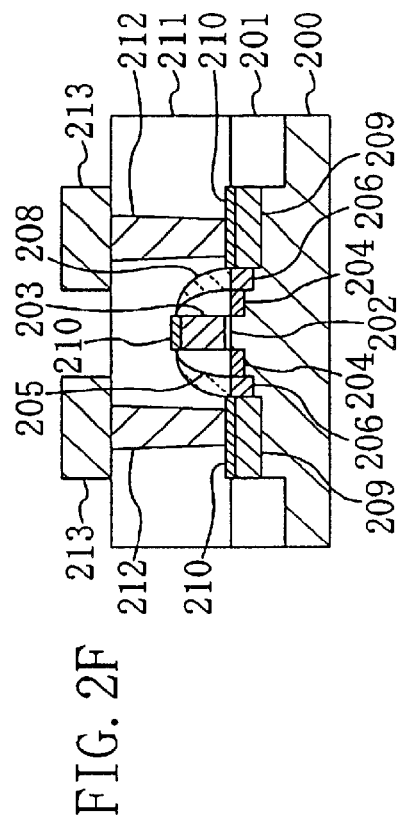

Next, as shown in FIG. 2B, after a silicon oxide film 207 about 60 nm thick is deposited all over the silicon substrate 200, then the silicon oxide film 207 is subjected to anisotropic dry etching. Thereby, as shown in FIG. 2C, second sidewall spacers 208 of silicon oxide film are formed on the side surfaces of the gate electrode 203 with the first sidewall spacers 205 interposed between the second sidewall spacers 208 and the gate electrode 203. Concretely, the second sidewall spacers 208 are formed on the portions of the first high concentration impurity regions 206 located in proximity to the low concentration impurity regions 204 and on the side surfaces of the first sidewall spacers 205.

Figure 2D:
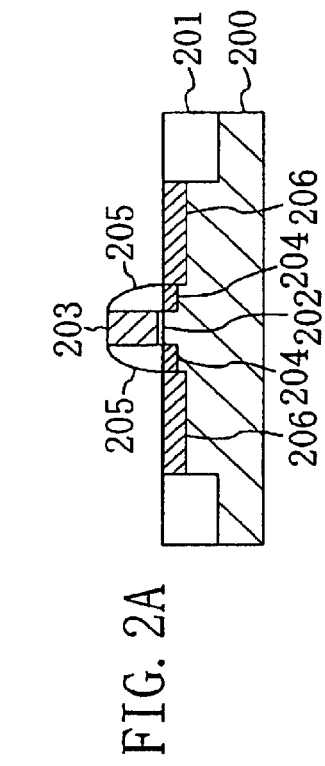

Next, by using the gate electrode 203, first sidewall spacers 205, and second sidewall spacers 208 as a mask, ion implantation is performed on the silicon substrate 200, thereby forming second high concentration impurity regions 209 having a deeper junction depth than the first high concentration impurity regions 206, as shown in FIG. 2D.

Figure 2E:
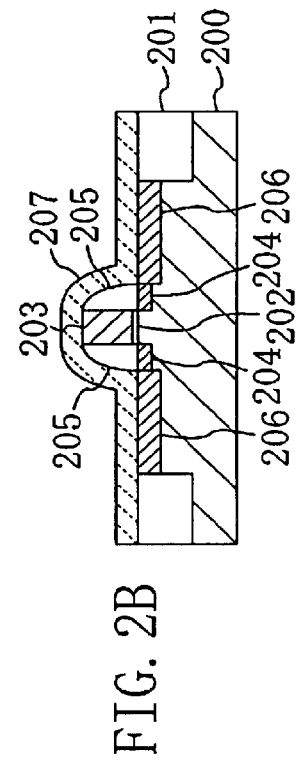

Next, after depositing a metal film of, for example, Co or Ni or the like all over the silicon substrate 200, by using the isolation insulating film 201, first sidewall spacers 205, and second sidewall spacers 208 as a mask, heat treatment is applied on the silicon substrate 200. This causes the above metal film to react with the silicon-exposed region of each surface of the silicon substrate 200 and the gate electrode 203, forming metal silicide films 210 on the gate electrode 203 and the second high concentration impurity regions 209, as shown in FIG. 2E. After that, an unreacted metal film is removed by wet etching using an etching solution including $H_2SO_4$ and $H_2O_2$ and the like.

Figure 2F:
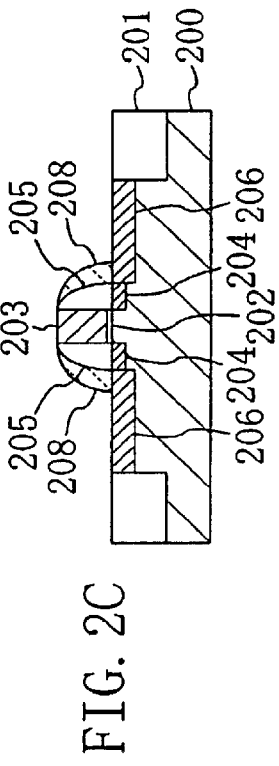

Next, after forming an interlayer insulating film 211 all over the silicon substrate 200 by using a known method as shown in FIG. 2F, then contacts 212 connecting to the second high concentration impurity regions 209 through the metal silicide films 210 are formed in the interlayer insulating film 211 and thereafter, metal wiring 213 connecting to the contacts 212 is formed on the interlayer insulating film 211. Thereby, the manufacturing of an n-type MISFET is completed, which MISFET comprises the gate electrode 203 having the metal silicide film 210 formed in the upper layer thereof, and the second high concentration impurity regions 209 on the surface of which the metal silicide films 210 are formed.

According to the second embodiment, after forming the low concentration impurity regions 204 on both sides of the gate electrode 203 in the silicon substrate 200, then the first sidewall spacers 205 are formed on the side surfaces of the gate electrode 203, and thereafter, the first high concentration impurity regions 206 are formed on both sides of the gate electrode 203 in the silicon substrate 200 so as to adjoin to the low concentration impurity regions 204. After that, the second sidewall spacers 208 are formed on the side surfaces of the gate electrode 203 with the first sidewall spacers 205 interposed between the second sidewall spacers 208 and the gate electrode 203, and thereafter, by using the gate electrode 203, first sidewall spacers 205, and second sidewall spacers 208 as a mask, ion implantation is performed on the silicon substrate 200, thereby forming the second high concentration impurity regions 209 having a deeper junction depth than the first high concentration impurity regions 206. After that, by using the isolation oxide film 201, first sidewall spacers 205, and second sidewall spacers 208 as a mask, the metal silicide films 210 are selectively formed on the respective silicon-exposed portions of the silicon substrate 200 and the gate electrode 203. That is, it is possible to lower the resistance of the gate electrode 203 by forming the metal silicide film 210 thereon. Also, because the metal silicide films 210 are formed on the second high concentration impurity regions 209 in a manner of self-alignment, the first high concentration impurity regions 206 located underneath the second sidewall spacers 208 are not silicidized. Thereby, the first high concentration impurity region 206 functions as a resistance element connected in series with the MIS type transistor, thus permitting an improvement in resistance to electrostatic discharge puncture caused by ESD and the like.

Further, according to the second embodiment, the metal silicide films 210 formed on the silicon substrate 200 are formed only on the surfaces of the second high concentration impurity regions 209 having a relatively deeper junction, thus ensuring suppression of the increase of junction leakage current resulting from the formation of the metal silicide films 210. Also, because the second high concentration impurity region 209 is separated from the channel region of the MIS type transistor by the first sidewall spacer 205 and the second sidewall spacer 208, it is possible to suppress the increase of variations (i.e., short channel effect) in the transistor characteristics resulting from the spread of a depletion layer from the second high concentration impurity region 209.

By the way, although in the second embodiment, polycrystalline silicon has been used as the material of the gate electrode 203, any semiconductor material such as silicon germanium or amorphous silicon may be used as the material of the gate electrode 203 without being particularly limited, provided it is a silicidizable material.

Also, although in the second embodiment, the first sidewall spacers 205 have a single layer structure of a silicon nitride film, instead of this, the first sidewall spacers 205 may have a multilayer structure of, for example, a silicon oxide film and a silicon nitride film.

Embodiment 3

Hereinafter, a semiconductor device and a manufacturing method thereof according to a third embodiment of the invention will be described with reference to drawings, by taking an n-type MISFET as an example.

FIGS. 3A to D and FIGS. 4A to C are cross-sectional views for showing each step in a method for manufacturing a semiconductor device according to the third embodiment.

Figure 3A:
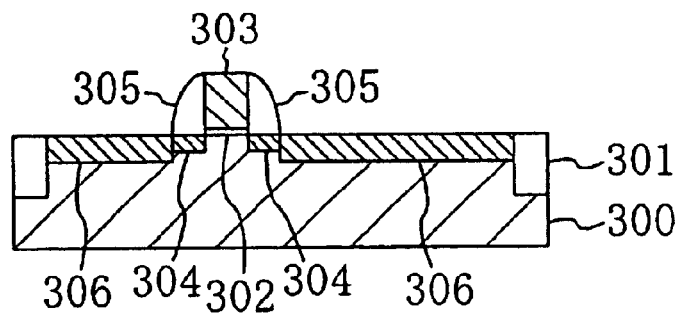
FIGS. 3A to D are cross-sectional views for showing each step in a method for manufacturing a semiconductor device according to a third embodiment of the invention.

First, as shown in FIG. 3A, after a transistor-forming region is partitioned in a p-type silicon substrate 300 by forming an isolation insulating film 301 of silicon oxide film, a gate insulating film 302 about 2 nm thick of a silicon oxynitride film is formed on the silicon substrate 300 by using a known method. After that, a gate electrode 303 about 150 nm thick of an n-type polycrystalline silicon film is formed on the gate insulating film 302. Then, by using the gate electrode 303 as a mask, ion implantation is performed on the silicon substrate 300, thereby forming n-type low concentration impurity regions 304. Then, after depositing a silicon nitride film about 60 nm thick all over the silicon substrate 300, this silicon nitride film is subjected to anisotropic dry etching, by which first sidewall spacers 305 are formed on the side surfaces of the gate electrode 303. Then, by using the gate electrode 303 and the first sidewall spacers 305 as a mask, ion implantation is performed on the silicon substrate 300, thereby forming first n-type high concentration impurity regions 306 to configure a source region and a drain region.

Figure 3B:
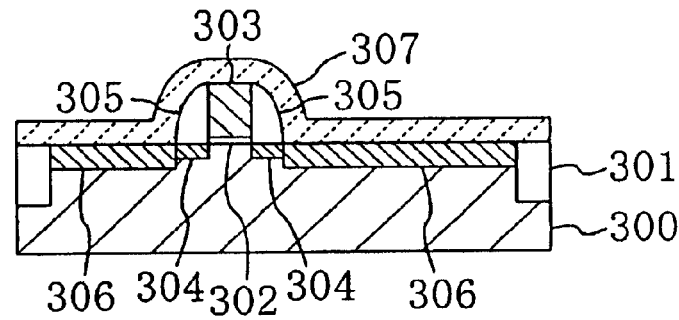
Figure 3C:
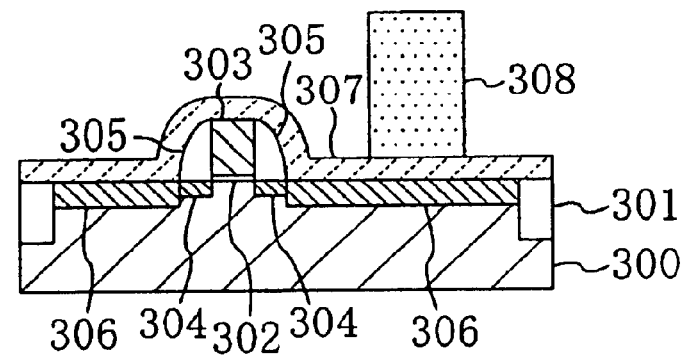

Next, after a silicon oxide film 307 about 60 nm thick is deposited all over the silicon substrate 300 as shown in FIG. 3B, a resist pattern 308 is formed to cover the portion of the silicon oxide film 307 deposited on the top side of a resistance element-forming region in the high concentration region 306, as shown in FIG. 3C.

Figure 3D:
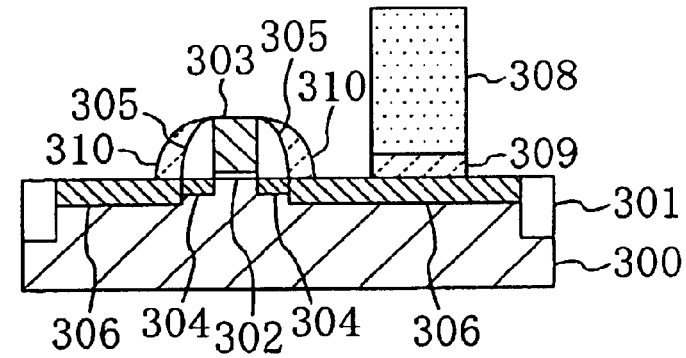
Figure 4A:
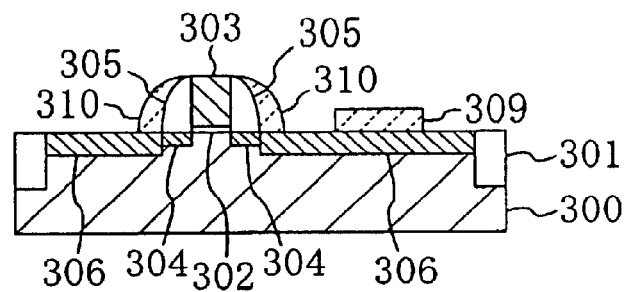
FIGS. 4A to C are cross-sectional views for showing each step in the method for manufacturing a semiconductor device according to the third embodiment of the invention.

Next, by using the resist pattern 308 as a mask, anisotropic dry etching is performed on the silicon oxide film 307. Thereby, as shown in FIG. 3D, the silicon oxide film 307 remains on the top side of the resistance element-forming region in the high concentration impurity region 306 to serve as a silicidization-preventing pattern 309, and at the same time, second sidewall spacers 310 of silicon oxide film are formed on the side surfaces of the gate electrode 303 with first sidewall spacers 305 interposed between the second sidewall spacers 310 and the gate electrode 303. At this time, the second sidewall spacers 310 are formed on the portions of the high concentration impurity regions 306 located in proximity to the low concentration impurity regions 304 and on the side surfaces of the first sidewall spacers 305. Thereafter, as shown in FIG. 4A, the resist pattern 308 is removed.

Figure 4B:
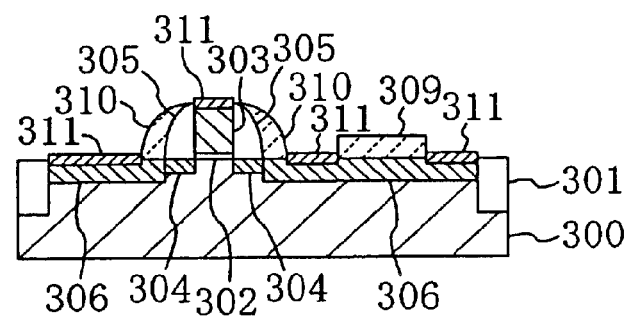

Next, after depositing of a metal film of, for example, Co or Ni or the like all over the silicon substrate 300, by using the isolation oxide films 301, first sidewall spacers 305, second sidewall spacers 310, and silicidization-preventing pattern 309 as a mask, heat treatment is applied on the silicon substrate 300. This causes the above metal film to react with the silicon-exposed region of each surface of the silicon substrate 300 and the gate electrode 303, forming metal silicide films 311 on the gate electrode 303 and on the high concentration impurity regions 306 except for their portions located underneath each of the second sidewall spacers 310 and the silicidization-preventing pattern 309, as shown in FIG. 4B. After that, an unreacted metal film is removed by wet etching using an etching solution including $H_2SO_4$ and $H_2O_2$ and the like.

Figure 4C:
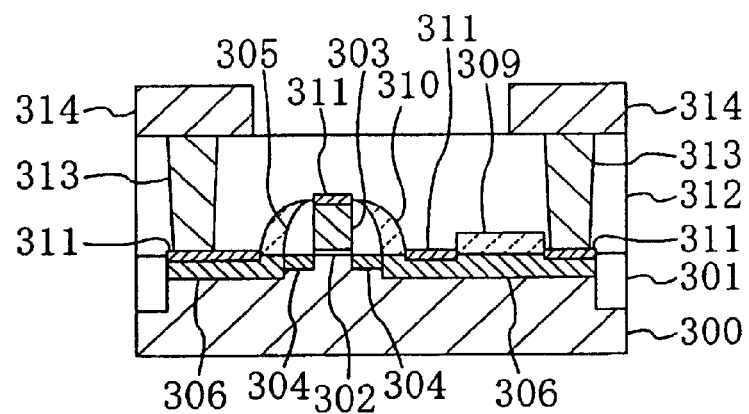

Next, after forming an interlayer insulating film 312 all over the silicon substrate 300 by using a known method as shown in FIG. 4C, then contacts 313 connecting to the high concentration impurity regions 306 via the metal silicide films 311 are formed in the interlayer insulating films 312, and thereafter, metal wiring 314 connecting to the contacts 313 is formed on the interlayer insulating film 312. Thereby, the manufacturing of an n-type MISFET is completed, which MISFET comprises the gate electrode 303 having the metal silicide film 311 formed in the upper layer thereof, and the high concentration impurity regions 306 having the metal silicide films 311 formed except for their portions located underneath each of the second sidewall spacers S310 and the silicidization-preventing pattern 309.

According to the third embodiment, after forming the low concentration impurity regions 304 on both sides of the gate electrode 303 in the silicon substrate 300, then the first sidewall spacers 305 are formed on the side surfaces of the gate electrode 303, and thereafter, the high concentration impurity regions 306 are formed on both sides of the gate electrode 303 in the silicon substrate 300 so as to adjoin to the low concentration impurity regions 304. After that, the silicidization-preventing pattern 309 is formed on the top side of the resistance element-forming region in the high concentration impurity region 306, and at the same time, the second sidewall spacers 310 are formed on the side surfaces of the gate electrode 303 with the first sidewall spacers 305 interposed between the second sidewall spacers 310 and the gate electrode 303. Then, by using the isolation insulating film 301, first sidewall spacers 305, second sidewall spacers 310, and silicidization-preventing pattern 309 as a mask, the metal silicide films 311 are formed on the respective silicon-exposed portions of the silicon substrate 300 and the gate electrode 303. That is, it is possible to lower the resistance of the gate electrode 303 by forming the metal silicide film 311 thereon. Also, the metal silicide films 311 can be formed, in a manner of self-alignment, on the high concentration impurity regions 306 except for their portions located underneath each of the second sidewall spacers 310 and the silicidization-preventing pattern 309. As a result, the portions of the high concentration impurity regions 306 located underneath the second sidewall spacers 310 (first resistance element) and the portion of the high concentration impurity region 306 located underneath the silicidization-preventing pattern 309 (second resistance element) each function as resistance elements connected in series with the MIS type transistor, thus permitting an improvement in resistance to electrostatic discharge puncture caused by ESD and the like.

Also, according to the third embodiment, it is possible to increase the degree of flexibility in designing the resistance value of a resistance element connected in series with the MIS type transistor. Further, in the present structure having the first resistance element and the second resistance element connected in series with the MIS type transistor, the resistance value from the channel region of the MIS type transistor to the contact 313 provided on the high concentration impurity region 306 is the combined resistance (R1+R2+R3+R4+R5) of the resistance of the low concentration impurity region 304 (R1), the resistance of the first resistance element in the high concentration impurity region 306 (R2), the resistance of the portion of the high concentration impurity region 306 located between the first resistance element and the second resistance element (R3) (i.e. the portion on which the metal silicide film 311 is formed), the resistance of the second resistance element in the high concentration impurity region 306 (R4), and the resistance of the portion of the highly impurity-doped region 306 located between the second resistance element and the contact 313 (i.e. the portion on which the metal silicide film 311 is formed) (R5). Herein, because the values of R1, R2, R4 and R3+R5, each does not depend on misalignment in a step of forming the resist pattern 308 to form the second resistance element, it is possible to suppress variations in resistance resulting from the misalignment.

By the way, although polycrystalline silicon has been used as the material of the gate electrode 303 in the third embodiment, any semiconductor material such as silicon germanium or amorphous silicon may be used as the material of the gate electrode 303 without being particularly limited, provided it is a silicidizable material.

Also, although, in the third embodiment, the first sidewall spacers 305 have a single layer structure of a silicon nitride film, instead of this, the first sidewall spacers 305 may have a multilayer structure of, for example, a silicon oxide film and a silicon nitride film.

Embodiment 4

Hereinafter, a semiconductor device and a manufacturing method thereof according to a fourth embodiment of the invention will be described with reference to drawings, taking an n-type MISFET as an example.

FIGS. 5A to C, FIGS. 6A to C, and FIGS. 7A and B are cross-sectional views for showing each step in a manufacturing method of a semiconductor device according to the fourth embodiment.

Figures 5A, 5B, 5C:
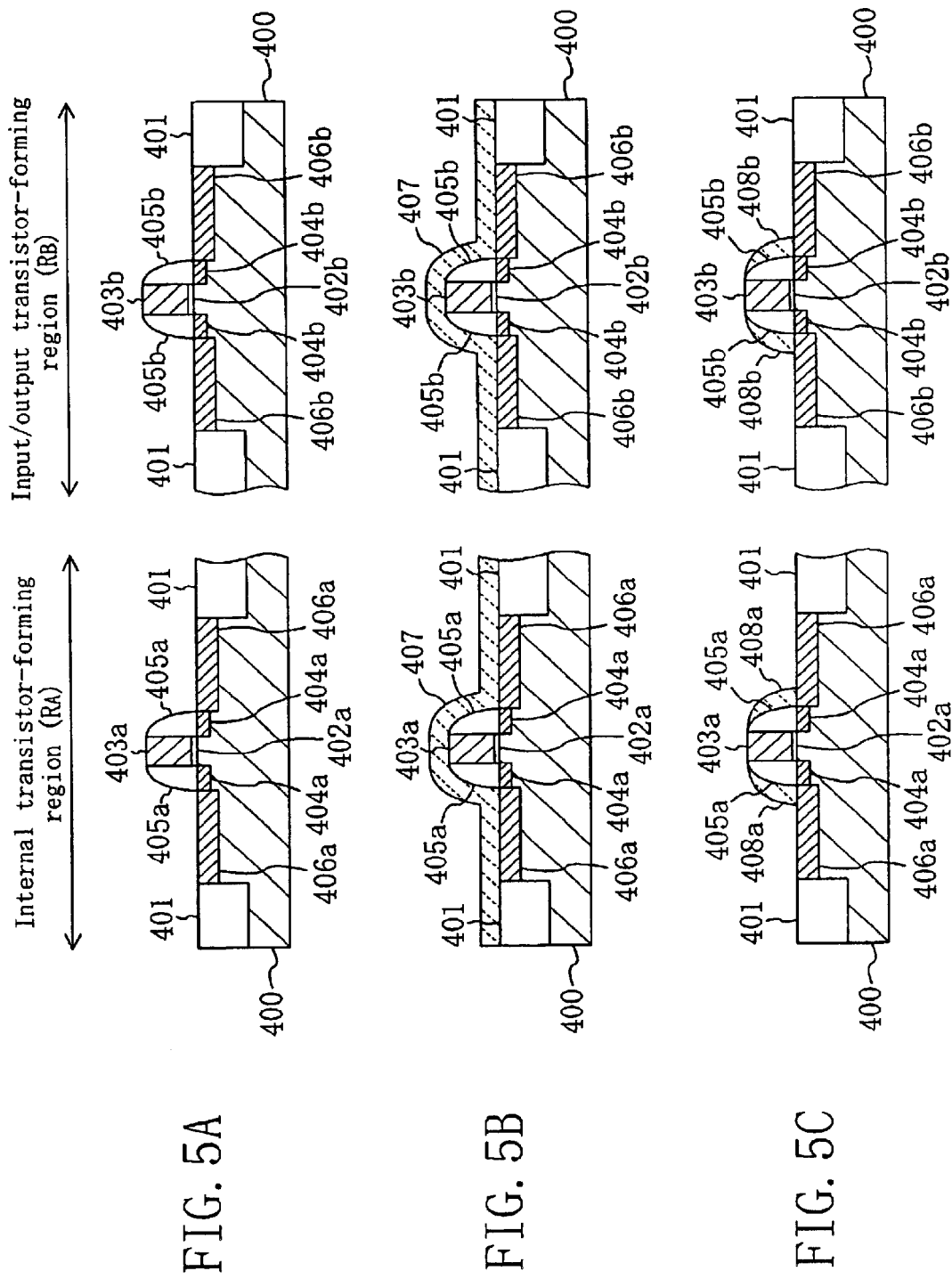
FIGS. 5A to C are cross-sectional views for showing each step in a method for manufacturing a semiconductor device according to a fourth embodiment of the invention.

First, as shown in FIG. 5A, an internal transistor-forming region $R_A$ and an input/output transistor-forming region $R_B$ are partitioned in a p-type silicon substrate 400 by forming an isolation insulating film 401 of silicon oxide film by means of HDP-CVD (high density plasma chemical vapor deposition) method. After that, by using a known method, a first gate electrode 403a about 150 nm thick of an n-type polycrystalline silicon film is formed on the internal transistor-forming region $R_A$ with a first gate insulating film 402a about 2 nm thick of silicon oxynitride film interposed between the first gate electrode 403a and the internal transistor-forming region $R_A$. Also, a second gate electrode 403b about 150 nm thick of an n-type polycrystalline silicon film is formed on the input/output transistor-forming region $R_B$ with a second gate insulating film 402b about 7 nm thick of a silicon oxynitride film interposed between the second gate electrode 403b and the input/output transistor forming region $R_B$. Thereafter, by using the first gate electrode 403a as a mask, ion implantation is performed on the internal transistor-forming region $R_A$, thereby forming n-type first low concentration impurity regions 404a. Further, by using the second gate electrode 403b as a mask, ion implantation is performed on the input/output transistor-forming region $R_B$, thereby forming n-type second low concentration impurity regions 404b. After that, after a silicon nitride film about 60 nm thick is deposited all over the silicon substrate 400, this silicon nitride film is subjected to anisotropic dry etching. Thereby, first sidewall spacers 405a are formed on the side surfaces of the first gate electrode 403a, and at the same time, second sidewall spacers 405b are formed on the side surfaces of the second gate electrode 403b. Thereafter, by using the first gate electrode 403a and first sidewall spacers 405a as a mask, ion implantation is performed on the internal transistor-forming region $R_A$, thereby forming n-type first high concentration impurity regions 406a to configure a source region and a drain region. Also, by using the second gate electrode 403b and second sidewall spacers 405b as a mask, ion implantation is performed on the input/output transistor-forming region $R_B$, thereby forming n-type second high concentration impurity regions 406b to configure a source region and a drain region.

Then, as shown in FIG. 5B, an insulating film 407 about 60 nm thick is deposited all over the silicon substrate 400. Here, as a material of the insulating film 407, it is preferable to use a material that can be wet etched with a high selectivity with respect to the isolation insulating film 401. If the isolation insulating film 401 is formed, for example, by the HDP-CVD method, the use of, for example, a NSG (non-doped silicate glass) film as the insulating film 407 can provide a wet etching rate of about three times faster than the isolation insulating film 401.

Next, anisotropic dry etching is performed on the insulating film 407, thereby forming third sidewall spacers 408b on the side surfaces of the second gate electrode 403b with the second sidewall spacers 405b interposed between the third sidewall spacers 408b and the second gate electrode 403b, as shown in FIG. 5C. At this time, the third sidewall spacers 408b are formed on the portions of the second high concentration impurity regions 406b located in proximity to the second low concentration impurity regions 404b and on the side surfaces of the second sidewall spacers 405b. Further, at this time, fourth sidewall spacers 408a are formed on the side surfaces of the first gate electrode 403a with the first sidewall spacers 405a interposed between the fourth sidewall spacers 408a and the first gate electrode 403a.

Next, after a resist pattern 409 is formed to cover the input/output transistor-forming region $R_B$ as shown in FIG. 6A, by using the resist pattern 409 as a mask, wet etching is performed on the fourth sidewall spacers 408a in the internal transistor-forming region $R_A$, thereby removing the fourth sidewall spacers 408a as shown in FIG. 6B. After that, as shown in FIG. 6C, the resist pattern 409 is removed.

Figure 7A:
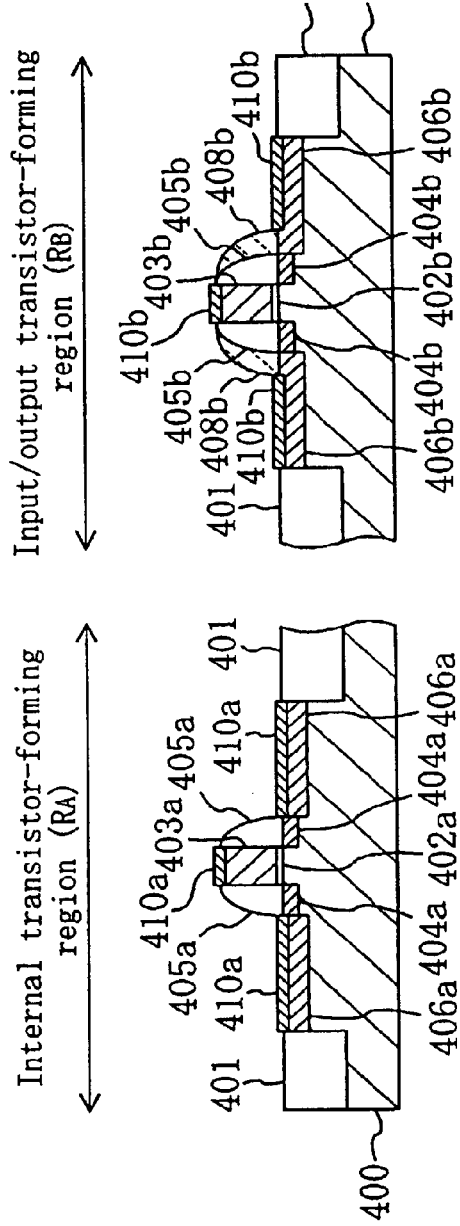
FIGS. 7A and B are cross-sectional views for showing each step in the method for manufacturing a semiconductor device according to the fourth embodiment of the invention.

Next, after depositing a metal film of, for example, Co or Ni or the like all over the silicon substrate 400, by using the isolation oxide films 401, first sidewall spacers 405a, second sidewall spacers 405b, and third sidewall spacers 408b as a mask, heat treatment is applied on the silicon substrate 400. This causes the above metal film to react with the silicon-exposed region of each surface of the silicon substrate 400, first gate electrode 403a, and second gate electrode 403b. As a result, as shown in FIG. 7A, first metal silicide films 410a are formed on each of the first gate electrode 403a and the first high concentration impurity regions 406a, and at the same time, second metal silicide films 410b are formed on the second gate electrode 403b and on the second high concentration impurity regions 406b except for their portions located underneath the third sidewall spacer 408b. After that, the unreacted metal film is removed by wet etching using an etching solution including $H_2SO_4$ and $H_2O_2$ and the like.

Figure 7B:
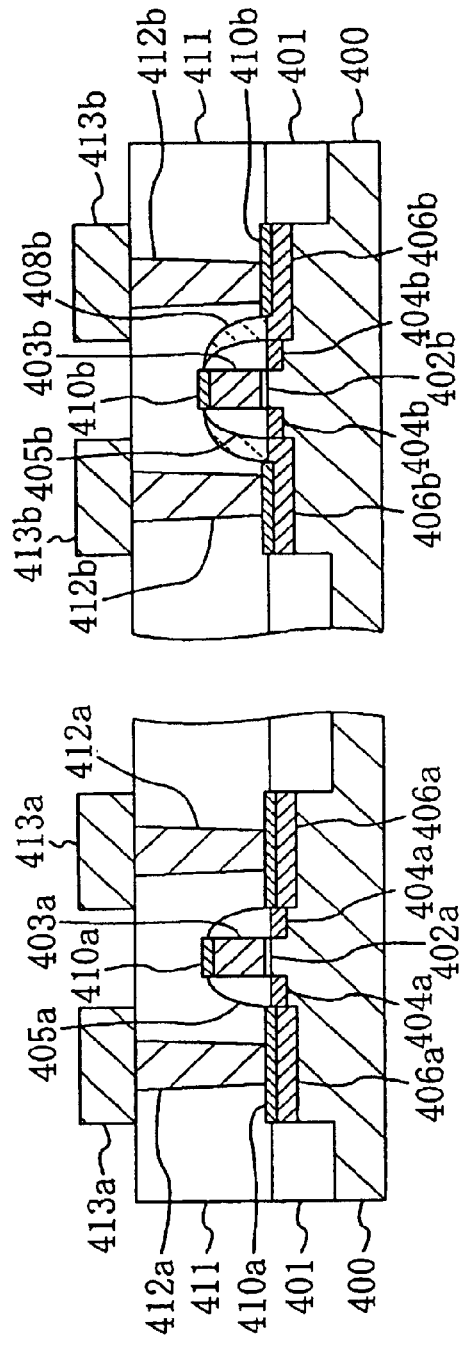

Next, after forming an interlayer insulating film 411 all over the silicon substrate 400 by using a known method as shown in FIG. 7B, then first contacts 412a connecting to the first high concentration impurity regions 406a via the first metal silicide films 410a and second contacts 412b connecting to the second high concentration impurity regions 406b via the second metal silicide films 410b are formed in the interlayer insulating film 411. After that, first metal wiring 413a connecting to the first contacts 412a and second metal wiring 413b connecting to the second contacts 412b are formed on the interlayer insulating film 411. Thereby, the manufacturing of a semiconductor device comprising an internal transistor, which has the first metal silicide films 410a formed on each of the first gate electrode 403a and the first high concentration impurity regions 406a, and an input/output transistor, which has the second metal silicide films 410b formed on the second gate electrode 403b and on the second high concentration impurity regions 406b except for their portions located underneath the third sidewall spacers 408b is completed.

According to the fourth embodiment, after forming the first low concentration impurity regions 404a on both sides of the first gate electrode 403a in the internal transistor-forming region $R_A$ of the silicon substrate 400 while forming the second low concentration impurity regions 404b on both sides of the second gate electrode 403b in the input/output transistor-forming region $R_B$ of the silicon substrate 400, then the first sidewall spacers 405a are formed on the side surfaces of the first gate electrode 403a and at the same time, the second sidewall spacers 405b are formed on the side surfaces of the second gate electrode 403b. Thereafter, the first high concentration impurity regions 406a are formed on both sides of the first gate electrode 403a in the internal transistor-forming region $R_A$ so as to adjoin to the first low concentration impurity regions 404a and, at the same time, the second high concentration impurity regions 406b are formed on both sides of the second gate electrode 403b in the input/output transistor-forming region $R_B$ so as to adjoin to the second low concentration impurity regions 404b. Then, after the third sidewall spacers 408b are formed on the side surfaces of the second gate electrode 403b with the second sidewall spacers 405b interposed between the sidewall spacers 408b and the second gate electrode 403b, by using the isolation insulating films 401, first sidewall spacers 405a, second sidewall spacers 405b, and third sidewall spacers 408b as a mask, first metal silicide films 410a or second metal silicide films 410b are selectively formed on the respective silicon-exposed portions of the silicon substrate 400, first gate electrode 403a, and second gate electrode 403b. That is, it is possible to silicidize the first gate electrode 403a and the first high concentration impurity regions 406a of the internal transistor as well as the second gate electrode 403b of the input/output transistor to lower their resistance. Further, the second metal suicide films 410b can be formed, in a manner of self-alignment, on the second high concentration impurity regions 406b except for their portions located underneath the third sidewall spacers 408b in the input/output transistor. Thus, those portions located underneath the third sidewall spacers 408b in the second high concentration impurity region 406b function as resistance elements connected in series with the input/output transistor, thereby improving resistance to electrostatic discharge puncture caused by ESD and the like. Further, in the surface of the silicon substrate 400, no first metal silicide film 410a is formed outside the first high concentration impurity regions 406a and further no second metal silicide film 410b is formed outside the second high concentration impurity regions 406b, thereby preventing junction leakage current from being increased in both of the internal transistor and input/output transistor.

Also, according to the fourth embodiment, in forming the third sidewall spacers 408b in the input/output transistor-forming region $R_B$, the fourth sidewall spacers 408a are also formed, on the side surfaces of the first gate electrode 403a in the internal transistor-forming region RA with the first sidewall spacers 405a interposed between the fourth sidewall spacers 408a and the first gate electrode 403a. After that, the resist pattern 409 covering the input/output transistor-forming region $R_B$ is used as a mask to wet etch the fourth sidewall spacers 408a to remove them, and then the resist pattern 409 is removed. As a result, only by a lithography step for forming the resist pattern 409 required for removing the fourth sidewall spacers 408a in the internal transistor-forming region $R_A$, the silicidized regions can be formed differently for each of the internal transistor and the input/output transistor.

By the way, in the fourth embodiment, its target has been a semiconductor device including the internal transistor and the input/output transistor, but, instead of this, it may target a semiconductor device including an internal transistor and an analog transistor or a cell transistor of DRAM.

Also, although in the fourth embodiment, polycrystalline silicon has been used as the materials of the first gate electrode 403a and the second gate electrode 403b, any semiconductor material such as silicon germanium or amorphous silicon may be used as the material of these gate electrodes without being particularly limited, provided it is a silicidizable material.

Also, although in the fourth embodiment, the first sidewall spacers 405a and the second sidewall spacers 405b have a single layer structure of a silicon nitride film, instead of this, these sidewall spacers may have a multilayer structure of, for example, a silicon oxide film and a silicon nitride film.

Also, in the fourth embodiment, as a material of the insulating film 407 to configure the fourth sidewall spacers 408a, it is preferable to use a material that can be wet etched with a high selectivity with respect to the isolation insulating film 401 or the insulating film to configure the first sidewall spacers 405a. This can prevent the isolation insulating film 401 or the first sidewall spacers 405a from being etched when wet-etching is performed on the fourth sidewall spacers 408a.

Variant of Embodiment 4

Hereinafter, a semiconductor device and a manufacturing method thereof according to a variant example of the fourth embodiment of the invention will be described with reference to drawings.

Figure 8:
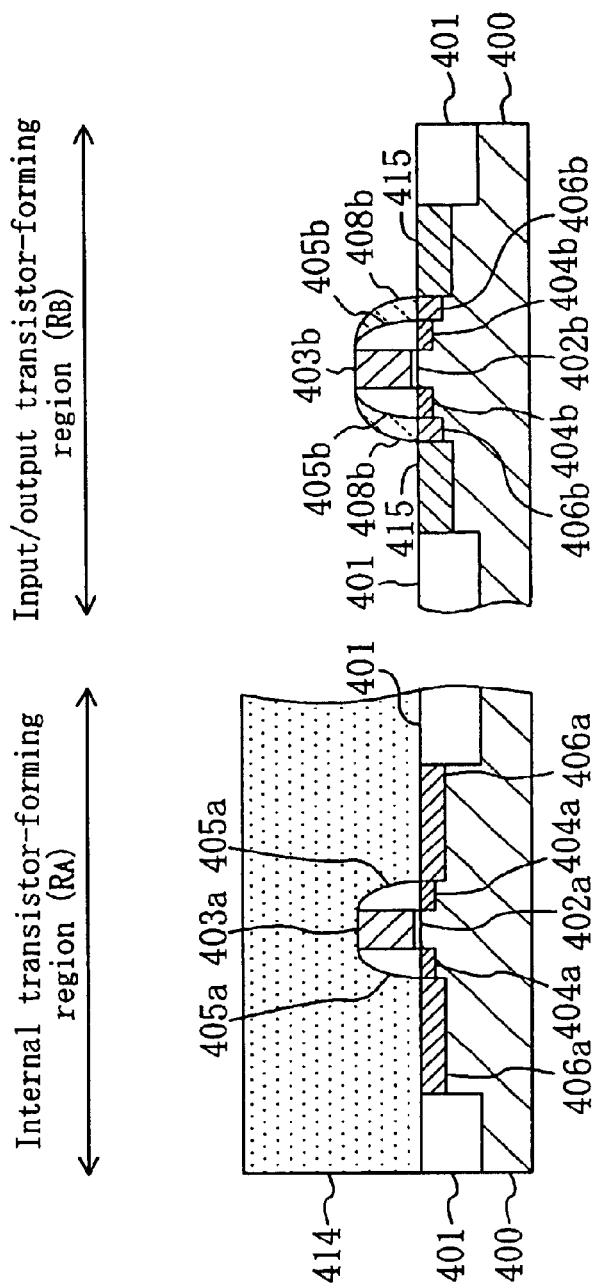
FIG. 8 is cross-sectional views for showing one step in a method for manufacturing a semiconductor device according to a variant example of the fourth embodiment of the invention.

FIG. 8 is a cross-sectional view for showing one step in a method for manufacturing a semiconductor device according to a variant example of the fourth embodiment. By the way, in FIG. 8, the same members as in the fourth embodiment shown in FIGS. 5A to C, FIGS. 6A to C, and FIGS. 7A and B are denoted by the same symbols and thus explanations thereof will be omitted.

The variant example of the fourth embodiment differs from the fourth embodiment in that a step shown in FIG. 8 is carried out in between the step shown in FIG. 6C and the step shown in FIG. 7A in the fourth embodiment. That is, by using the resist pattern 414 covering the internal transistor-forming region $R_A$, second gate electrode 403b, second sidewall spacers 405b, and third sidewall spacers 408b as a mask, in between the step for forming the third sidewall spacers 408b and the step for forming the first metal silicide films 410a and the second metal silicide films 410b, ion implantation is performed on the input/output transistor-forming region $R_B$. This forms a third high concentration impurity region 415 having a deeper junction than the second high concentration impurity regions 406b. In other words, the depth of the second high concentration impurity regions 406b except for those portions located underneath the third sidewall spacers 408b is made deeper than the depth of those portions located underneath the third sidewall spacers 408b in the second high concentration impurity regions 406b.

According to the variant example of the fourth embodiment, in addition to the advantages of the fourth embodiment, the following advantages can be obtained. That is, the second metal silicide films 410b formed on the second high concentration impurity regions 406b is formed only on the surface of the relatively-deeper-junction portions of the second high concentration impurity regions 406b (i.e. the third high concentration impurity regions 415), thereby reliably suppressing the increase of junction leakage current resulting from the formation of the second metal silicide film 410b. Also, because the third high concentration impurity regions 415 are separated from the channel region of the input/output transistor by the second sidewall spacers 405b and the third sidewall spacers 408b, it is possible to suppress the increase of variations in transistor characteristics resulting from the spread of a depletion layer from the third high concentration impurity region 415 (i.e. short channel effect).

Embodiment 5

Hereinafter, a semiconductor device and a manufacturing method thereof according to a fifth embodiment of the invention will be described with reference to drawings, taking an n-type MISFET as an example.

FIGS. 9A to C, FIGS. 10A to C, FIGS. 11A and B, and FIGS. 12A and B are cross-sectional views for showing each step in a manufacturing method of a semiconductor device according to the fifth embodiment.

First, as shown in FIG. 9A, an internal transistor-forming region $R_A$ and an input/output transistor-forming region $R_B$ are partitioned in a p-type silicon substrate 500 by forming an isolation insulating film 501 of silicon oxide film. After that, by using a known method, a first gate electrode 503a about 150 nm thick of an n-type polycrystalline silicon film is formed on the internal transistor-forming region $R_A$ with a first gate insulating film 502a about 2 nm thick of silicon oxynitride interposed between the first gate electrode 503a and the internal transistor-forming region $R_A$. Also, a second gate electrode 503b about 150 nm thick of an n-type polycrystalline silicon film is formed on the input/output transistor-forming region $R_B$ with a second gate insulating film 502b about 7 nm thick of silicon oxynitride film interposed between the second gate electrode 503b and the input/output transistor-forming region $R_B$. Thereafter, by using the first gate electrode 503a as a mask, ion implantation is performed on the internal transistor-forming region $R_A$, thereby forming n-type first low concentration impurity regions 504a. Further, by using the second gate electrode 503b as a mask, ion implantation is performed on the input/output transistor-forming region $R_B$, thereby forming n-type second low concentration impurity regions 504b. After that, after a silicon nitride film about 60 nm thick is deposited all over the silicon substrate 500, this silicon nitride film is subjected to anisotropic dry etching. Thereby, first sidewall spacers 505a are formed on the side surfaces of the first gate electrode 503a, and at the same time, second sidewall spacers 505b are formed on the side surfaces of the second gate electrode 503b. Thereafter, by using the first gate electrode 503a and first sidewall insulating films 505a as a mask, ion implantation is performed on the internal transistor-forming region $R_A$, thereby forming n-type first high concentration impurity regions 506a to configure a source region and a drain region. Also, by using the second gate electrode 503b and second sidewall insulating films 505b as a mask, ion implantation is performed on the input/output transistor-forming region $R_B$, thereby forming the second high concentration impurity regions 506b to configure a source region and a drain region.

Next, after an oxide film 507 about 60 nm thick is deposited all over the silicon substrate 500 as shown in FIG. 9B, a first resist pattern 508 covering the internal transistor-forming region $R_A$ is formed as shown in FIG. 9C.

Next, by using the first resist pattern 508 as a mask, anisotropic dry etching is performed on the silicon oxide film 507, by which third sidewall spacers 509 are formed, on the side surfaces of the second gate electrode 503b in the input/output transistor-forming region $R_B$ with the second sidewall spacers 505b interposed between the third sidewall spacers 509 and the second gate electrode 503b, as shown in FIG. 10A. At this time, the third sidewall spacers 509 are formed on the portions of the second high concentration impurity regions 506b located in proximity to the second low concentration impurity regions 504b and on the side surfaces of the second sidewall spacers 505b. Thereafter, the first resist pattern 508 is removed as shown in FIG. 10B.

Next, after a second resist pattern 510 is formed to cover the input/output transistor-forming region $R_B$ as shown in FIG. 10C, by using the second resist pattern 510 as a mask, wet etching is performed on the residual portion of the silicon oxide film 507 remaining on the internal transistor-forming region $R_A$ (that is, the portion of the silicon oxide film 507 formed on the first gate electrode 503a and the first high concentration impurity regions 506a and the like). Thereby, as shown in FIG. 11A, the residual portion of the silicon oxide film 507 remaining on the internal transistor-forming region $R_A$ is removed. After that, as shown in FIG. 11B, the second resist pattern 510 is removed.

Next, after depositing a metal film of, for example, Co or Ni or the like all over the silicon substrate 500, by using the isolation oxide film 501, first sidewall spacers 505a, second sidewall spacers 505b, and third sidewall spacers 509 as a mask, heat treatment is applied on the silicon substrate 500. This causes the above metal film to react with the silicon-exposed region of each surface of the silicon substrate 500, the first gate electrode 503a, and the second gate electrode 503b. As a result, as shown in FIG. 12A, first metal silicide films 511a are formed on each of the first gate electrode 503a and the first high concentration impurity regions 506a, and at the same time, second metal silicide films 511b are formed on the second gate electrode 503b and on the second high concentration impurity regions 506b except for their portions located underneath the third sidewall spacers 509. After that, an unreacted metal film is removed by wet etching using an etching solution including $H_2SO_4$ and $H_2O_2$ and the like.

Next, after forming an interlayer insulating film 512 all over the silicon substrate 500 by using a known method as shown in FIG. 12B, then first contacts 513a connecting to the first high concentration impurity regions 506a via the first metal silicide films 511a and second contacts 513b connecting to the second high concentration impurity regions 506b via the second metal silicide films 511b are formed in the interlayer insulating film 512. After that, first metal wiring 514a connecting to the first contacts 513a and second metal wiring 514b connecting to the second contacts 513b are formed on the interlayer insulating film 512. Thereby, the manufacturing of a semiconductor device is completed, which device comprises an internal transistor having the first metal silicide films 511a formed on each of the first gate electrode 503a and the first high concentration impurity regions 506a, and an input/output transistor having the second metal silicide films 511b formed on the second gate electrode 503b and on the second high concentration impurity regions 506b except for their portions located underneath the third sidewall spacers 509.

According to the fifth embodiment, after forming the first low concentration impurity regions 504a on both sides of the first gate electrode 503a in the internal transistor-forming region $R_A$ of the silicon substrate 500 while forming the second low concentration impurity regions 504b on both sides of the second gate electrode 503b in the input/output transistor-forming region $R_B$ of the silicon substrate 500, then the first sidewall spacers 505a are formed on the side surfaces of the first gate electrode 503a and at the same time, the second sidewall spacers 505b are formed on the side surfaces of the second gate electrode 503b. Thereafter, the first high concentration impurity regions 506a are formed on both sides of the first gate electrode 503a in the internal transistor-forming region $R_A$ so as to adjoin to the first low concentration impurity regions 504a, and, at the same time, the second high concentration impurity regions 506b are formed on both sides of the second gate electrode 503b in the input/output transistor-forming region $R_B$ so as to adjoin to the second low concentration impurity regions 504b. Then, after the third sidewall spacers 509 are formed on the side surfaces of the second gate electrode 503b with the second sidewall spacers 505b interposed between the third sidewall spacers 509 and the second gate electrode 503b, by using the isolation insulating film 501, first sidewall spacers 505a, second sidewall spacers 505b, and third sidewall spacers 509 as a mask, the first metal silicide films 511a or the second metal silicide films 511b are selectively formed on the respective silicon-exposed portions of the silicon substrate 500, the first gate electrode 503a, and the second gate electrode 503b. That is, it is possible respectively to silicidize the first gate electrode 503a and the first high concentration impurity regions 506a of the internal transistor as well as the second gate electrode 503b of the input/output transistor to lower their resistance. Also, the second metal silicide film 511b can be formed, in a manner of self-alignment, on the second high concentration impurity regions 506b except for their portions located underneath the third sidewall spacers 509 in the input/output transistor. As a result, those portions located underneath the third sidewall spacers 509 of the second high concentration impurity region 506b function as resistance elements connected in series with the input/output transistor, thereby improving resistance to electrostatic discharge puncture caused by ESD and the like. Further, in the surface of the silicon substrate 500, no first metal silicide film 511a is formed outside the first high concentration impurity regions 506a and further no second metal silicide film 511b is formed outside the second high concentration impurity regions 506b, thereby preventing junction leakage current from being increased in both of the internal transistor and input/output transistor.

Also, according to the fifth embodiment, in the formation of the third sidewall spacers 509 in the input/output transistor-forming region $R_B$, by using the first resist pattern 508 covering the internal transistor-forming region as a mask, anisotropic dry etching is performed on the silicon oxide film 507 being to configure the third sidewall spacers 509, and thereby the third sidewall spacers 509 are formed. After that, the first resist pattern 508 is removed. Then, the second resist pattern 510 covering the input/output transistor-forming region $R_B$ is used as a mask to wet etch a residual portion of the silicon oxide film 507 remaining on the internal transistor-forming region $R_A$, and thereby the residual portion is removed. Thereafter, the second resist pattern 510 is removed. That is, by performing a lithography step for forming the first resist pattern 508 required for forming the third sidewall spacers 509 in the input/output transistor-forming region $R_B$, and a lithography step for forming the second resist pattern 510 required for removing the residual portion of the silicon oxide film 507 remaining on the internal transistor-forming region $R_A$, it is possible to form the silicidized regions differently for each of the internal transistor and the input/output transistor. As a result, although the number of lithography steps increases when compared with the fourth embodiment, on the other hand, the selective wet etching of the fourth sidewall spacers 408a becomes unnecessary, which selective wet etching is required if the fourth sidewall spacers 408a are formed in the internal transistor-forming region $R_A$ as in the fourth embodiment (see FIG. 5C and FIGS. 6A to C). Therefore, according to the fifth embodiment, it is possible to increase the process margin in the wet etching step compared with the fourth embodiment, thereby preventing the isolation insulating film 501 being etched, for example.

By the way, in the fifth embodiment, its target has been a semiconductor device including the internal transistor and the input/output transistor, but, instead of this, it may target a semiconductor device including an internal transistor and an analog transistor or a cell transistor of DRAM.

Also, although, in the fifth embodiment, polycrystalline silicon has been used as the materials of the first gate electrode 503a and the second gate electrode 503b, any semiconductor material such as silicon germanium or amorphous silicon may be used as the material of these gate electrodes without being particularly limited, provided it is a silicidizable material.

Also, although, in the fifth embodiment, the first sidewall spacers 505a and the second sidewall spacers 505b have a single layer structure of a silicon nitride film, instead of this, these sidewall spacers may have a multilayer structure of, for example, a silicon oxide film and a silicon nitride film.

Variant of Embodiment 5

Hereinafter, a semiconductor device and a manufacturing method thereof according to a variant example of the fifth embodiment of the invention will be described with reference to drawings.

FIGS. 13A to C, FIGS. 14A to C, FIGS. 15A to C, and FIGS. 16A to C are cross-sectional views for showing each step in a method for manufacturing a semiconductor device according to the fifth embodiment. By the way, in FIGS. 13A to C, FIGS. 14A to C, FIGS. 15A to C, and FIGS. 16A to C, the same members as in FIGS. 9A to C, FIGS. 10A to C, FIGS. 11A and B and FIGS. 12A and B are denoted by the same symbols and their explanations can be omitted.

Figures 13A, 13B, 13C:
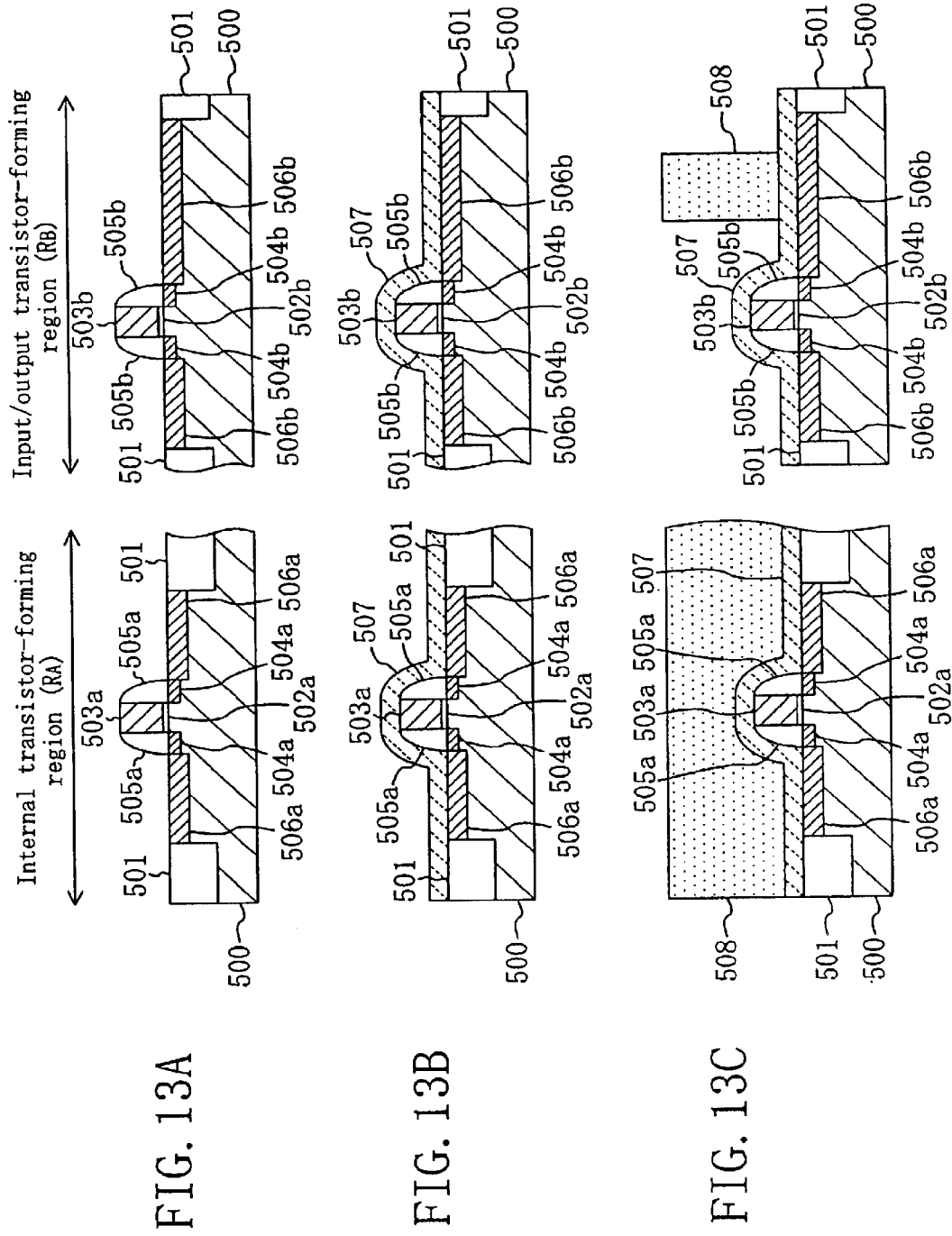
FIGS. 13A to C are cross-sectional views for showing each step in a method for manufacturing a semiconductor device according to a variant example of the fifth embodiment of the invention.

The steps shown in FIGS. 13A and B of a variant example of the fifth embodiment are the same as the steps shown in FIGS. 9A and B of the fifth embodiment, and therefore their explanation will be omitted.

Next, as shown in FIG. 13C, a first resist pattern 508 is formed to cover the portion of the silicon oxide film 507 formed on the internal transistor-forming region $R_A$ and the portion of the silicon oxide film 507 deposited on the resistance element-forming region in the second high concentration impurity regions 506b.

Next, by using the first resist pattern 508 as a mask, anisotropic dry etching is performed on the silicon oxide film 507. Thereby, as shown in FIG. 14A, third sidewall spacers 509 are formed, on the side surfaces of the second gate electrode 503b in the input/output transistor-forming region $R_B$ with the second sidewall spacers 505b interposed between the third sidewall spacers 509 and the second gate electrode 503b. Also, the silicon oxide film 507 for serving as a silicidization-preventing pattern 515 is left on the top side of the resistance element-forming region in the second high concentration impurity regions 506b. After that, as shown in FIG. 14B, the first resist pattern 508 is removed.

Next, after a second resist pattern 510 is formed to cover the input/output transistor-forming region $R_B$ as shown in FIG. 14C, by using the second resist pattern 510 as a mask, wet etching is performed on the residual portion of the silicon oxide film 507 remaining on the internal transistor-forming region $R_A$. Thereby, as shown in FIG. 15A, the residual portion of the silicon oxide film 507 remaining on the internal transistor-forming region $R_A$ is removed. After that, as shown in FIG. 15B, the second resist pattern 510 is removed.

Next, after a third resist pattern 516 is formed to cover the internal transistor-forming region $R_A$ as shown in FIG. 15C, by using the third resist pattern 516, second gate electrode 503, second sidewall spacers 505, and third sidewall spacers 509 as a mask, ion implantation is performed on the input/output transistor-forming region $R_B$. Thereby, third high concentration impurity regions 517 having a deeper junction than the second high concentration impurity regions 506b are formed. In other word, the depth of the second high concentration impurity regions 506b except for their respective portions located underneath the third sidewall spacers 509 and the silicidization-preventing pattern 515 is made deeper than the depth of the respective portions located underneath the third sidewall spacers 509 and the silicidization-preventing pattern 515 in the second high concentration impurity regions 506b. After that, as shown in FIG. 16A, the third resist pattern 516 is removed.

Next, after depositing a metal film of, for example, Co or Ni or the like all over the silicon substrate 500, by using the isolation oxide films 501, first sidewall spacers 505a, second sidewall spacers 505b, third sidewall spacers 509, and silicidization-preventing pattern 515 as a mask, heat treatment is applied on the silicon substrate 500. This causes the above metal film to react with the silicon-exposed region of each surface of the silicon substrate 500, the first gate electrode 503a, and the second gate electrode 503b. As a result, as shown in FIG. 16B, first metal silicide films 511a are formed on each of the first gate electrode 503a and the first high concentration impurity regions 506a, and at the same time, second metal silicide films 511b are formed on the second gate electrode 503b as well as on the second high concentration impurity regions 506b except for their respective portions located underneath the third sidewall spacer 509 and the silicidization-preventing pattern 515. After that, an unreacted metal film is removed by wet etching using an etching solution including $H_2SO_4$ and $H_2O_2$ and the like.

Next, after forming an interlayer insulating film 512 all over the silicon substrate 500 by using a known method as shown in FIG. 16C, then first contacts 513a connecting to the first high concentration impurity regions 506a through the first metal silicide films 511a and second contacts 513b connecting to the second high concentration impurity regions 506b through the second metal silicide films 511b are formed in the interlayer insulating film 512. After that, first metal wiring 514a connecting to the first contacts 513a and second metal wiring 514b connecting to the second contacts 513b are formed on the interlayer insulating film 512. Thereby, the manufacturing of a semiconductor device is completed, which device comprises an internal transistor having the first metal silicide films 511a formed on each of the first gate electrode 503a and the first high concentration impurity regions 506a, and an input/output transistor having the second metal silicide films 511b formed on the second gate electrode 503b and on the second high concentration impurity regions 506b except for their respective portions located underneath the third sidewall spacers 509 and the silicidization-preventing pattern 515.

According to the variant example of the fifth embodiment, in addition to the advantages of the fifth embodiment, the following advantages can be obtained. That is, the second metal silicide films 511b formed on the second high concentration impurity regions 506b are formed only on the surface of the relatively-deeper-junction portions of the second high concentration impurity regions 506b (i.e. the third high concentration impurity regions 517), thereby reliably suppressing the increase of junction leakage current resulting from the formation of the second metal silicide film 511b. Also, the third high concentration impurity regions 517 are separated from the channel region of the input/output transistor by the second sidewall spacers 505b and the third sidewall spacers 509, and therefore it is possible to suppress the increase of variations in transistor characteristics resulting from the spread of a depletion layer from the third high concentration impurity region 517 (i.e. short channel effect).

Further, according to the variant example of the fifth embodiment, after forming the silicidization-preventing pattern 515 on the top side of the resistance element-forming region in the second high concentration impurity region 506b, by using the silicidization-preventing pattern as a mask, the second metal silicide films 511b are formed. As a result, the portion of the second high concentration impurity region 506b located underneath the silicidization-preventing pattern 515 is easily formed into a resistance element connected in series with the MIS type transistor, thereby simply improving resistance to electrostatic discharge puncture caused by ESD and the like.

Embodiment 6

Hereinafter, a semiconductor device and a manufacturing method thereof according to a sixth embodiment of the invention will be described with reference to drawings, taking an n-type MISFET as an example.

FIGS. 17A to D and FIGS. 18A to E are cross-sectional views for showing each step in a manufacturing method of a semiconductor device according to the sixth embodiment.

Figure 17A:
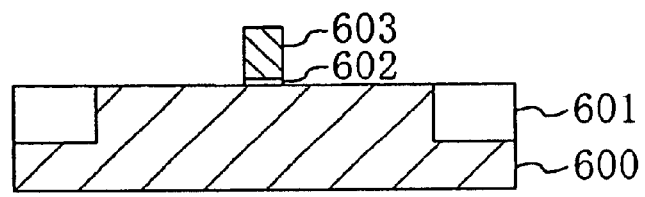
FIGS. 17A to D are cross-sectional views for showing each step in a method for manufacturing a semiconductor device according to a sixth embodiment of the invention.

First, as shown in FIG. 17A, after a transistor-forming region is partitioned in a p-type silicon substrate 600 by forming an isolation insulating film 601 of silicon oxide, a gate insulating film 602 about 2 nm thick of silicon oxynitride is formed on the silicon substrate 600 by using a known method. After that, a gate electrode 603 about 150 nm thick of an n-type polycrystalline silicon film is formed on the gate insulating film 602.

Figure 17B:
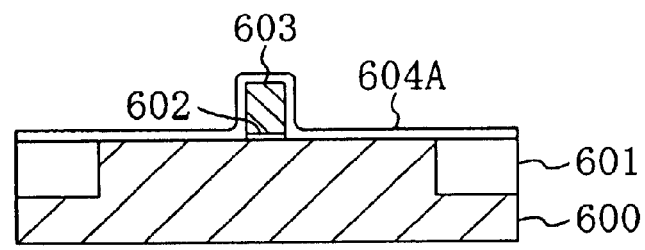
Figure 17C:
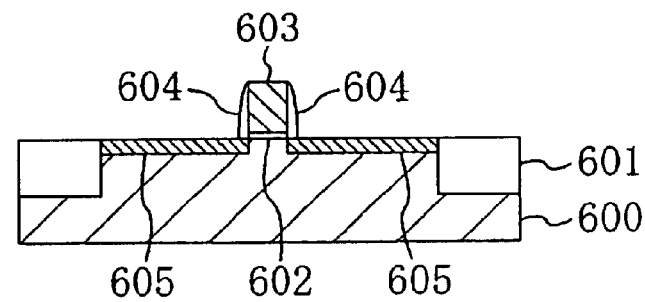

Next, after depositing a silicon oxide film 604A having a thickness of 5 to 20 nm all over the silicon substrate 600 as shown in FIG. 17B, anisotropic dry etching is performed on the silicon oxide film 604A, thereby forming offset spacers 604 of silicon oxide on the side surfaces of the gate electrode 603 as shown in FIG. 17C. Next, by using the gate electrode 603 and the offset spacers 604 as a mask, ion implantation is performed on the silicon substrate 600, thereby forming n-type low concentration impurity regions 605.

Figure 17D:
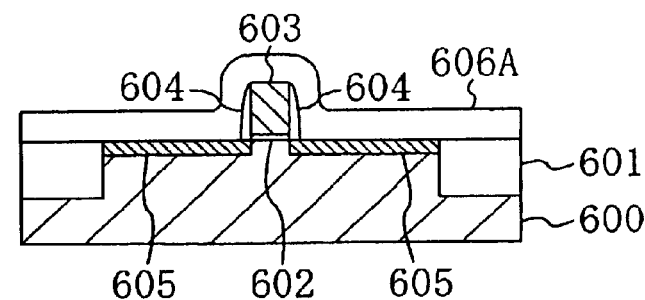
Figure 18A:
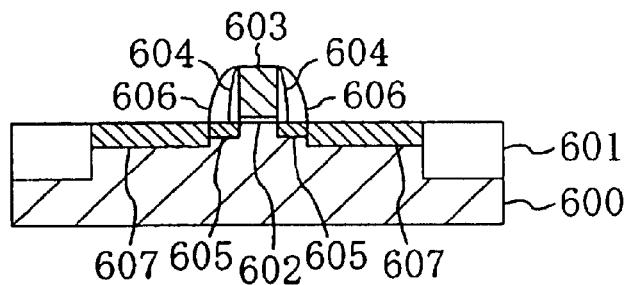
FIGS. 18A to E are cross-sectional views for showing each step in the method for manufacturing a semiconductor device according to the sixth embodiment of the invention.

Next, after a silicon nitride film 606A about 60 nm thick is deposited all over the silicon substrate 600 as shown in FIG. 17D, anisotropic dry etching is performed on the silicon nitride film 606A. Thereby, as shown in FIG. 18A, first sidewall spacers 606 of silicon nitride are formed on the side surfaces of the gate electrode 603 with the offset spacers 604 interposed between the first sidewall spacers 606 and the gate electrode 603. Then, by using the gate electrode 603, offset spacers 604, and first sidewall spacers 606 as a mask ion implantation is performed on the silicon substrate 600, thereby forming n-type high concentration impurity regions 607 being to configure a source region and a drain region.

Figure 18B:
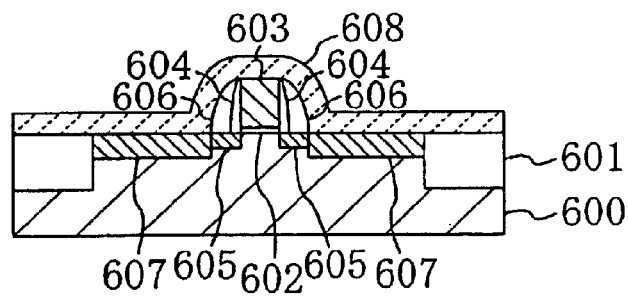
Figure 18C:
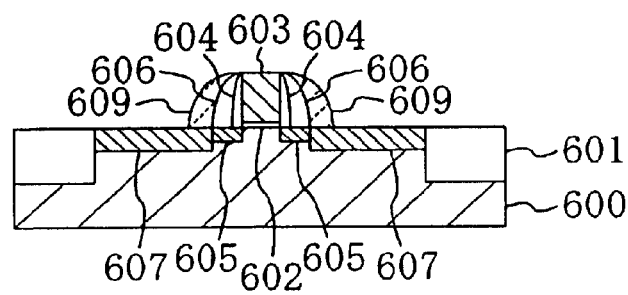

Next, after a silicon oxide film 608 about 60 nm thick is deposited all over the silicon substrate 600 as shown in FIG. 18B, the silicon oxide film 608 is subjected to anisotropic dry etching. Thereby, as shown in FIG. 18C, second sidewall spacers 609 of silicon oxide are formed on the side surfaces of the gate electrode 603 with the offset spacer 604 and the first sidewall spacer 606 interposed between the second sidewall spacers 609 and the gate electrode 603. At this time, the second sidewall spacers 609 are formed on the portions of the high concentration impurity regions 607 located in proximity to the low concentration impurity regions 605 and on the side surfaces of the first sidewall spacers 606.

Figure 18D:
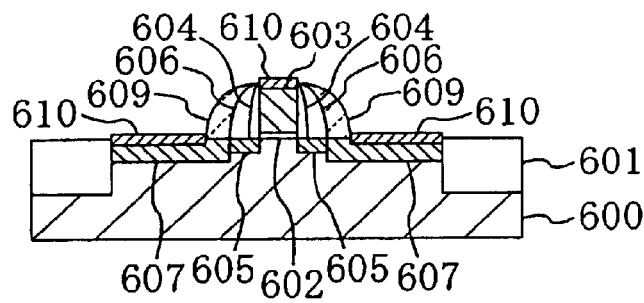

Next, after depositing a metal film of, for example, Co or Ni or the like all over the silicon substrate 600, by using the isolation insulating film 601, offset spacers 604, first sidewall spacers 606, and second sidewall spacers 609 as a mask, heat treatment is applied on the silicon substrate 600. This causes the above metal film to react with the silicon-exposed region of each surface of the silicon substrate 600 and the gate electrode 603, thereby forming metal silicide films 610 on the gate electrode 603 and on the high concentration impurity regions 607 except for their portions located underneath the second sidewall spacers 609, as shown in FIG. 18D. After that, an unreacted metal film is removed by wet etching using an etching solution including $H_2SO_4$ and $H_2O_2$ and the like.

Figure 18E:
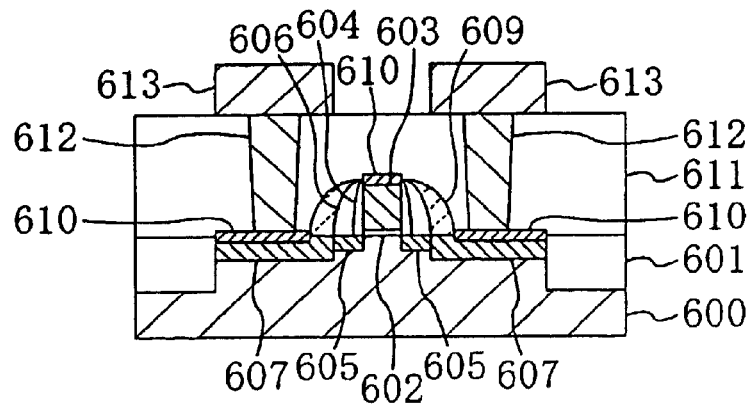
Figures 19A, 19B, 19C:
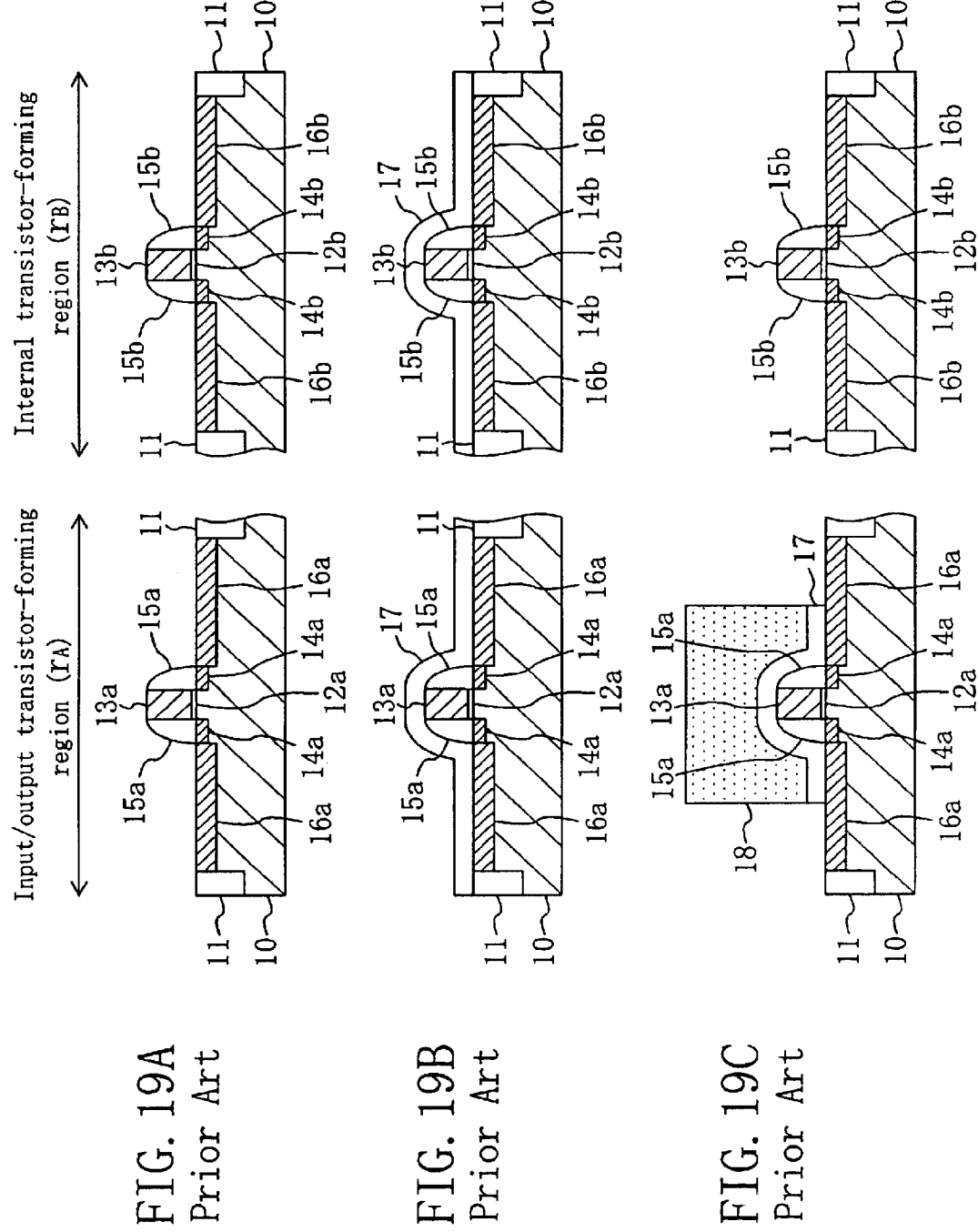
FIGS. 19A to C are cross-sectional views for showing each step in a method for manufacturing a semiconductor device according to a first conventional example.
Figures 20A, 20B, 20C:
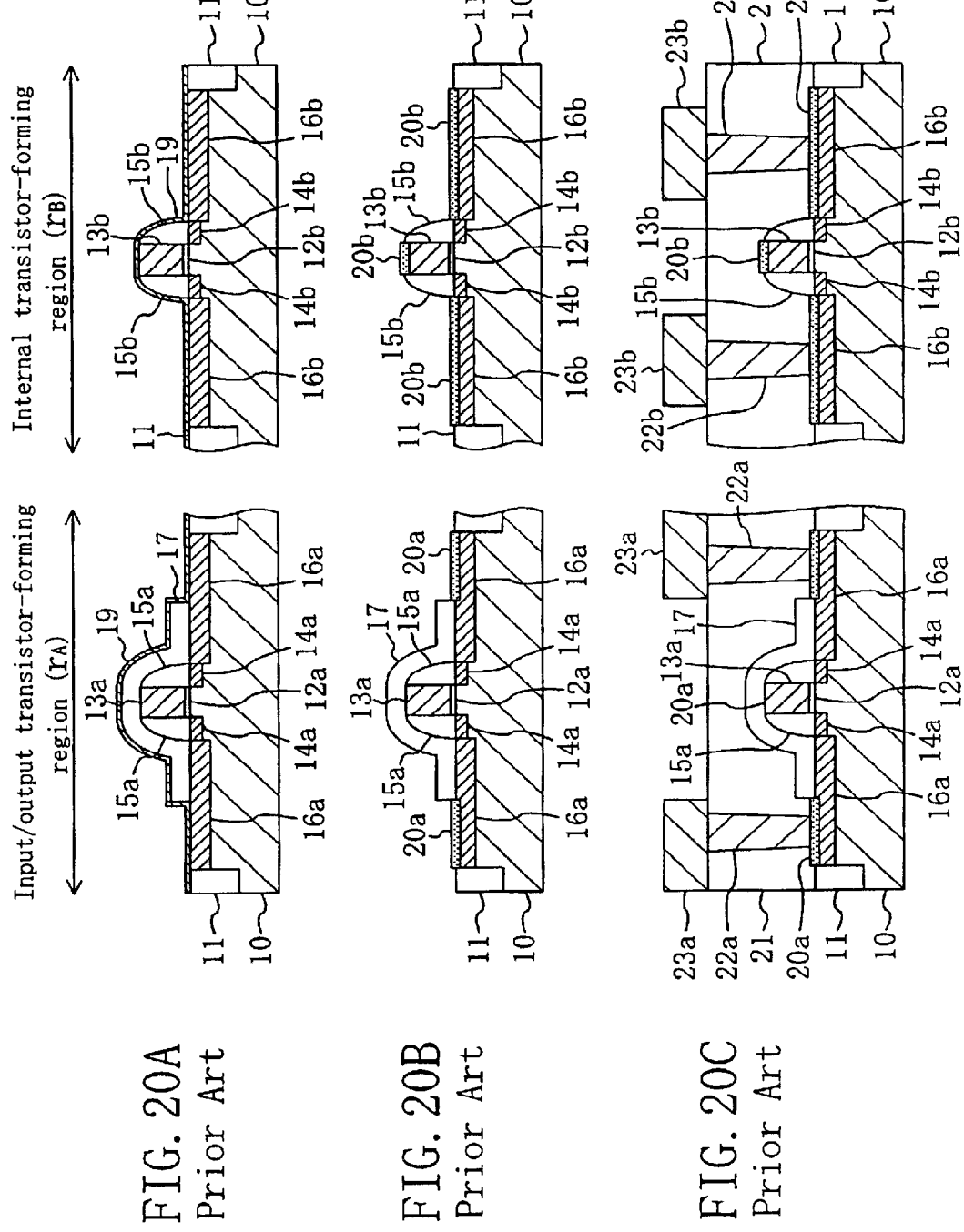
FIGS. 20A to C are cross-sectional views for showing each step in the method for manufacturing a semiconductor device according to the first conventional example.

Next, after forming an interlayer insulating film 611 all over the silicon substrate 600 by using a known method as shown in FIG. 18E, then contacts 612 connecting to the high concentration impurity regions 607 through the metal silicide films 610 are formed in the interlayer insulating film 611, and thereafter, metal wiring 613 connecting to the contact 612 is formed on the interlayer insulating film 611. Thereby, the manufacturing of an n-type MISFET is completed, which MISFET comprises the gate electrode 603 having the metal silicide film 610 formed on the upper layer thereof and the high concentration impurity regions 607 except for their portions located underneath the second sidewall spacers 609 having the metal silicide film 610 formed thereon.

According to the sixth embodiment, after forming the low concentration impurity regions 605 on both sides of the gate electrode 603 in the silicon substrate 600, then the first sidewall spacers 606 are formed on the side surfaces of the gate electrode 603, and thereafter, the high concentration impurity regions 607 are formed on both sides of the gate electrode 603 in the silicon substrate 600 so as to adjoin to the low concentration impurity regions 605. Then, after the second sidewall spacers 609 are formed on the side surfaces of the gate electrode 603 with the first sidewall spacer 606 interposed between the second sidewall spacers 609 and the gate electrode 603, by using the isolation insulating film 601, first sidewall spacers 606, and second sidewall spacers 609 as a mask, the metal silicide films 610 are selectively formed on the respective silicon-exposed portions of the silicon substrate 600 and the gate electrode 603. That is, it is possible to lower the resistance of the gate electrode 603 by forming the metal silicide film 610 thereon. Also, the metal silicide films 610 can be formed, in a manner of self-alignment, on the high concentration impurity regions 607 except for their portions located underneath the second sidewall spacers 609, and further the portions located underneath the second sidewall spacers 609 of the high concentration impurity region 607 function as resistance elements connected in series with the MIS type transistor, thereby improving resistance to electrostatic discharge puncture caused by ESD and the like.

Also, according to the sixth embodiment, after forming the gate electrode 603, the offset spacers 604 are formed on the side surfaces of the gate electrode 603. Thereafter, by using the gate electrode 603 and the offset spacers 604 as a mask, ion implantation is performed on the silicon substrate 600, thereby forming the low concentration impurity regions 605. As a result, an overlap length between the gate electrode 603 and the source and drain regions can be made short, thus permitting a decrease in overlap capacitance produced between the gate electrode 603 and the source and drain regions. Therefore, the parasitic capacitance of the MIS type transistor can be decreased, thus increasing the circuit operation speed.

By the way, although, in the sixth embodiment, polycrystalline silicon has been used as the material of the gate electrode 603, any semiconductor material such as silicon germanium or amorphous silicon may be used as the material of the gate electrode 603 without being particularly limited, provided it is a silicidizable material.

Also, although, in the sixth embodiment, the first sidewall spacers 606 have a single layer structure of a silicon nitride film, instead of this, the first sidewall spacers 606 may have a multilayer structure of, for example, a silicon oxide film and a silicon nitride film.

Further, also in each of the first to fifth embodiments, offset spacers may be formed in a manner similar to the sixth embodiment. Concretely, in the first embodiment, after the formation of the gate electrode 103, offset spacers may be formed on the side surfaces of the gate electrode 103, and thereafter, by using the gate electrode 103 and offset spacers as a mask, ion implantation may be performed on the silicon substrate 100 to form the low concentration impurity regions 104. Also, in the second embodiment, after the formation of the gate electrode 203, offset spacers may be formed on the side surfaces of the gate electrode 203, and thereafter, by using the gate electrode 203 and offset spacers as a mask, ion implantation may be performed on the silicon substrate 200 to form the low concentration impurity regions 204. Also, in the third embodiment, after the formation of the gate electrode 303, offset spacers may be formed on the side surfaces of the gate electrode 303, and thereafter, by using the gate electrode 303 and offset spacers as a mask, ion implantation is performed on the silicon substrate 300 to form the low concentration impurity regions 304. Also, in the fourth embodiment, it is preferable that particularly after forming the first gate electrode 403a on the internal transistor-forming region $R_A$, offset spacers are formed on the side surfaces of the first gate electrode 403a, and thereafter, by using the first gate electrode 403a and offset spacers as a mask, ion implantation is performed on the silicon substrate 400 to form the first low concentration impurity regions 404a. At this time, offset spacers may be also formed on the side surfaces of the second gate electrode 403b in the input/output transistor-forming region $R_B$. Also, in the fifth embodiment, it is preferable that particularly after forming the first gate electrode 503a on the internal transistor-forming region $R_A$, offset spacers are formed on the side surfaces of the first gate electrode 503a, and thereafter, by using the first gate electrode 503a and the offset spacers as a mask, ion implantation is performed on the silicon substrate 500 to form the first low concentration impurity regions 504a. At this time, offset spacers may be also formed on the side surfaces of the second gate electrode 503b in the input/output transistor-forming region $R_B$.

What is claimed is:

1. A method for manufacturing a semiconductor device, comprising the steps of:

forming a gate electrode on a semiconductor substrate;

forming low concentration impurity regions by performing ion implantation on said semiconductor substrate by using said gate electrode as a mask;

depositing a first insulating film over said semiconductor substrate in which said low concentration impurity regions are formed;

forming first sidewall insulating films on the side surfaces of said gate electrode by performing anisotropic dry etching on said first insulating film;

forming high concentration impurity regions by performing ion implantation on said semiconductor substrate by using said gate electrode and said first sidewall insulating films as a mask;

depositing a second insulating film over said semiconductor substrate in which said high concentration impurity regions are formed;

forming second sidewall insulating films on the portions of said high concentration impurity regions located in proximity to said low concentration impurity regions and on the side surfaces of said first sidewall insulating films by performing anisotropic dry etching on said second insulating film; and selectively forming metal silicide layers on the exposed region of each surface of said semiconductor substrate and said gate electrode by using said first sidewall insulating films and said second sidewall insulating films as a mask.

2. The method for manufacturing a semiconductor device according to claim 1, further comprising a step of:

performing ion implantation on said semiconductor substrate by using said gate electrode, said first sidewall insulating films, and said second sidewall insulating films as a mask, in between the step of forming said second sidewall insulating films and the step of forming said metal silicide layers, making the depth of said high concentration impurity regions except for their portions located underneath said second sidewall insulating films deeper than the depth of these portions located underneath said second sidewall insulating films in said high concentration impurity regions.

3. The method for manufacturing a semiconductor device according to claim 1, further comprising a step of:

forming a resist pattern to cover the portion of said second insulating film deposited on the top side of a resistance element-forming region in said high concentration impurity region, in between the step of depositing said second insulating film and the step of forming said second sidewall insulating films; and wherein:

the step of forming said second sidewall insulating films includes a step of performing anisotropic dry etching on said second insulating film by using said resist pattern as a mask to leave said second insulating film on said resistance element-forming region.

4. The method for manufacturing a semiconductor device according to claim 1, further comprising a step of:

forming offset spacers on the side surfaces of said gate electrode in between the step of forming said gate electrode and the step of forming said low concentration impurity regions; and wherein:

the step of forming said low concentration impurity regions includes a step of performing ion implantation on said semiconductor substrate by using said gate electrode and said offset spacers as a mask to form said low concentration impurity regions.

5. A method for manufacturing a semiconductor device, comprising the steps of:

partitioning a first transistor-forming region and a second transistor-forming region by forming an isolation insulating film in a semiconductor substrate;

forming a first gate electrode on said first transistor-forming region with a first gate insulating film interposed between the first gate electrode and the first transistor-forming region;

forming a second gate electrode on said second transistor-forming region with a second gate insulating film interposed between the second gate electrode and said second transistor-forming region;

forming first low concentration impurity regions by performing ion implantation on said first transistor-forming region by using said first gate electrode as a mask;

forming second low concentration impurity regions by performing ion implantation on said second transistor-forming region by using said second gate electrode as a mask;

depositing a first insulating film over the semiconductor substrate in which said first low concentration impurity regions and said second low concentration impurity regions have been provided;

forming first sidewall insulating films on the side surfaces of said first gate electrode and, at the same time, forming second sidewall insulating films on the side surfaces of said second gate electrode, by performing anisotropic dry etching on said first insulating film;

forming first high concentration impurity regions by performing ion implantation on said first transistor-forming region by using said first gate electrode and said first sidewall insulating films as a mask;

forming second high concentration impurity regions by performing ion implantation on said second transistor-forming region by using said second gate electrode and said second sidewall insulating films as a mask;

depositing a second insulating film over said semiconductor substrate in which said first high concentration impurity regions and said second high concentration impurity regions have been formed;

forming third sidewall insulating films on the portions of said second high concentration impurity regions located in proximity of said second low concentration impurity regions and on the side surfaces of said second sidewall insulating films, by performing anisotropic dry etching on said second insulating film; and selectively forming metal silicide layers on the exposed region of each surface of said first transistor-forming region, said second transistor-forming region, said first gate electrode, and said second gate electrode by using said isolation insulating films, said first sidewall insulating films, said second sidewall insulating films, and said third sidewall insulating films as a mask.

6. The method for manufacturing a semiconductor device according to claim 5, wherein;

the step of forming said third sidewall insulating films includes a step of forming fourth sidewall insulating films on the portions of said first high concentration impurity regions located in proximity of said first low concentration impurity regions and on the side surfaces of said first sidewall insulating films: and further comprising the step of;

selectively removing said fourth sidewall insulating films by using a resist pattern covering said second transistor-forming region as a mask, and thereafter removing said resist pattern, in between the step of forming said third sidewall insulating films and the step of forming said metal silicide layers.

7. The method for manufacturing a semiconductor device according to claim 5, wherein;

the step of forming said third sidewall insulating films includes a step of forming said third sidewall insulating films by performing anisotropic dry etching on said second insulating film by using a first resist pattern covering said first transistor-forming region as a mask, and thereafter removing said first resist pattern: and further comprising a step of;

selectively removing the residual portion of said second insulating film remaining on said first transistor-forming region by using a second resist pattern covering said second transistor-forming region as a mask, and thereafter removing said second resist pattern, in between the step of forming said third sidewall insulating films and the step of forming said metal silicide layers.

8. The method for manufacturing a semiconductor device according to claim 7, wherein:

said first resist pattern is formed to cover the portion of said second insulating film lying on the top side of a resistance element-forming region in said second high concentration impurity region; and the step of forming said third sidewall insulating films includes a step of leaving said second insulating film on said resistance element-forming region.

9. The method for manufacturing a semiconductor device according to claim 5, further comprising a step of:

performing ion implantation on said second transistor-forming region by using the resist pattern covering said first transistor-forming region, said second gate electrode, said second sidewall insulating films, and said third sidewall insulating films as a mask, making the depth of said second high concentration impurity regions except for their portions located underneath said third sidewall insulating films deeper than the depth of these portions located underneath said third sidewall insulating films in said second high concentration impurity regions, in between the step of forming said third sidewall insulating films and the step of forming said metal silicide layers.

* * * * *

UNITED STATES PATENT AND TRADEMARK OFFICE
CERTIFICATE OF CORRECTION

PATENT NO.   : 6,890,824 B2
DATED        : May 10, 2005
INVENTOR(S)  : Yamada, Takayuki et al.

It is certified that error appears in the above-identified patent and that said Letters Patent is hereby corrected as shown below:

Title page,
Item [56], References Cited, insert
-- U.S. PATENT DOCUMENTS

| | | | |
|---|---|---|---|
| 6,599,792 * | 07/2003 | Jung, Woo-chan | 438/303 |
| 6,562,671 * | 05/2003 | Ohnuma, Hideto | 438/160 |
| 6,555,464 * | 04/2003 | Fukada et al. | 438/622 |
| 6,509,254 * | 01/2003 | Matsumoto et al. | 438/591 |
| 6,500,704 * | 12/2002 | Hirano et al. | 438/166 |
| 6,486,516 * | 11/2002 | Hachisuka, Atsushi | 257/368 |
| 6,468,914 * | 10/2002 | Jang et al. | 438/699 |
| 6,403,459 * | 06/2002 | Ohashi et al. | 438/618 |
| 6,342,440 * | 01/2002 | Sasada et al. | 438/530 |
| 5,612,557 * | 03/1997 | Kondo et al. | 257/288 |
| 5,183,771 * | 02/1993 | Mitsui et al. | 438/302 -- |

Signed and Sealed this

Ninth Day of August, 2005

JON W. DUDAS
*Director of the United States Patent and Trademark Office*